United States Patent
Lee et al.

(10) Patent No.: US 11,985,855 B2
(45) Date of Patent: May 14, 2024

(54) LIGHT EMITTING DISPLAY DEVICE HAVING REDUCED INTERFERENCE BETWEEN ADJACENT PIXELS

(71) Applicant: Samsung Display Co., LTD., Yongin-si (KR)

(72) Inventors: Chang-Soo Lee, Suwon-si (KR); Bo Yong Chung, Suwon-si (KR); Tak-Young Lee, Anyang-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 266 days.

(21) Appl. No.: 17/475,321

(22) Filed: Sep. 14, 2021

(65) Prior Publication Data
US 2022/0223672 A1 Jul. 14, 2022

(30) Foreign Application Priority Data
Jan. 8, 2021 (KR) .......................... 10-2021-0002779

(51) Int. Cl.
*H10K 59/12* (2023.01)
*H10K 59/121* (2023.01)

(52) U.S. Cl.
CPC ..... *H10K 59/1213* (2023.02); *H10K 59/1216* (2023.02)

(58) Field of Classification Search
CPC ....................... H10K 59/1213; H10K 59/1216
USPC .......................................................... 257/40
See application file for complete search history.

(56) References Cited

U.S. PATENT DOCUMENTS

| 9,117,407 | B2 | 8/2015 | Kim |
| 10,573,243 | B2 | 2/2020 | Choi et al. |
| 10,748,979 | B2 | 8/2020 | Kim et al. |
| 2017/0162122 | A1* | 6/2017 | In .......................... G09G 3/3291 |
| 2017/0206840 | A1* | 7/2017 | Cho ....................... G09G 3/3266 |
| 2020/0185481 | A1* | 6/2020 | Park ....................... H10K 59/123 |

FOREIGN PATENT DOCUMENTS

| KR | 10-2018-0089928 | 8/2018 |
| KR | 10-1951665 | 2/2019 |
| KR | 10-2019-0128801 | 11/2019 |
| KR | 10-2019-0135585 | 12/2019 |
| KR | 10-2020-0088953 | 7/2020 |

* cited by examiner

*Primary Examiner* — Phuc T Dang
(74) *Attorney, Agent, or Firm* — KILE PARK REED & HOUTTEMAN PLLC

(57) ABSTRACT

A light emitting display device including a first pixel including a first driving transistor, a first input transistor, a first initialization transistor, a first storage capacitor, and a first light emitting diode (LED); and a second pixel including a second driving transistor, a second input transistor, a second initialization transistor, a second storage capacitor, and a second light emitting diode (LED. The first pixel further includes a first gate electrode connecting member connecting a first gate electrode of the first driving transistor and the first input transistor; the second pixel further includes a second gate electrode connecting member connecting a second gate electrode of the second driving transistor and the second input transistor; the first light emitting diode (LED) includes a first anode; the second light emitting diode (LED) includes a second anode; and the first gate electrode connecting member does not overlap the second anode in a plan view.

18 Claims, 12 Drawing Sheets

LIGHT EMITTING DISPLAY DEVICE HAVING REDUCED INTERFERENCE BETWEEN ADJACENT PIXELS

CROSS-REFERENCE TO RELATED APPLICATION

This application claims priority from and the benefit of Korean Patent Application No. 10-2021-0002779, filed on Jan. 8, 2021, which is hereby incorporated by reference for all purposes as if fully set forth herein.

BACKGROUND

Field

Embodiments of the invention relate generally to a light emitting display device, and more specifically, to a light emitting display device that reduces interference between adjacent pixels.

Discussion of the Background

A display device is a device that displays a screen, and includes a liquid crystal display (LCD), an organic light emitting diode (OLED), and the like. The display device is used in various electronic devices, such as a mobile phone, a navigation device, a digital camera, an electronic book, a portable game machine, and various terminals.

Among these electronic devices, the organic light emitting display has a self-luminance characteristic, and unlike the liquid crystal display, a separate light source is not required, so thickness and weight may be reduced. In addition, the organic light emitting display has many highly desirable characteristics, such as low power consumption, high luminance, and fast response time.

The above information disclosed in this Background section is only for understanding of the background of the inventive concepts, and, therefore, it may contain information that does not constitute prior art.

SUMMARY

Embodiments of the invention provide a light emitting display device having improved display quality by reducing interference between adjacent pixels.

Additional features of the inventive concepts will be set forth in the description which follows, and in part will be apparent from the description, or may be learned by practice of the inventive concepts.

An embodiment of the present invention provides a light emitting display device including: a first pixel including a first driving transistor, a first input transistor, a first initialization transistor, a first storage capacitor, and a first light emitting diode (LED); and a second pixel including a second driving transistor, a second input transistor, a second initialization transistor, a second storage capacitor, and a second light emitting diode (LED). The first pixel further includes a first gate electrode connecting member connecting a first gate electrode of the first driving transistor and the first input transistor; the second pixel further includes a second gate electrode connecting member connecting a second gate electrode of the second driving transistor and the second input transistor; the first light emitting diode (LED) includes a first anode; the second light emitting diode (LED) includes a second anode; and the first gate electrode connecting member does not overlap the second anode in a plan view.

The first pixel may further include a first upper storage electrode positioned on the first gate electrode and a first lower storage electrode positioned under the first gate electrode, and the second pixel may further include a second upper storage electrode disposed on the second gate electrode and a second lower storage electrode disposed under the second gate electrode.

The first gate electrode may overlap the first upper storage electrode or the first lower storage electrode in a plan view; the first storage capacitor may include the first lower storage electrode, the first gate electrode, and the first upper storage electrode; the second gate electrode may overlap the second upper storage electrode or the second lower storage electrode in a plan view; and the second storage capacitor may include the second lower storage electrode, the second gate electrode, and the second upper storage electrode.

The first gate electrode may have a first protruded part that does not overlap the first upper storage electrode or the first lower storage electrode in a plan view; the first protruded part may be electrically connected to the first gate electrode connecting member; the second gate electrode may have a second protruded part that does not overlap the second upper storage electrode or the second lower storage electrode in a plan view; and the second protruded part may be electrically connected to the second gate electrode connecting member.

The first gate electrode may be positioned within a boundary of the first upper storage electrode or the first lower storage electrode except for the first protruded part in a plan view; and the second gate electrode may be positioned within a boundary of the second upper storage electrode or the second lower storage electrode except for the second protruded part in a plan view.

The first initialization transistor may be electrically connected to the first upper storage electrode, and the second initialization transistor may be electrically connected to the second upper storage electrode.

The first upper storage electrode and the first lower storage electrode may be electrically connected, and the second upper storage electrode and the second lower storage electrode may be electrically connected to each other.

The second gate electrode connecting member may not overlap the first anode in a plan view.

A third pixel including a third driving transistor, a third input transistor, a third initialization transistor, a third storage capacitor, and a third light emitting diode (LED) may be further included. The third pixel may further include a third gate electrode connecting member connecting a third gate electrode of the third driving transistor and the third input transistor; the third light emitting diode (LED) may include a third anode; and the third gate electrode connecting member may not overlap the second anode and the third anode in a plan view.

The third anode may not overlap the first gate electrode connecting member and the second gate electrode connecting member in a plan view.

The gate electrode of the first input transistor and the gate electrode of the second input transistor may be integrally formed, and the gate electrode of the first initialization transistor and the gate electrode of the second initialization transistor may be integrally formed.

The gate electrode of the first input transistor and the gate electrode of the first initialization transistor may each receive the same control signal or a control signal at different timings from each other, and the gate electrode of the second input transistor and the gate electrode of the second initialization transistor may each receive the same control signal or a control signal at different timings from each other.

The first pixel may further include a first emission part capacitor connected to both ends of the first light emitting diode (LED), and the second pixel may further include a second emission part capacitor connected to both ends of the second light emitting diode (LED).

Another embodiment of the present invention provides a light emitting display device including: a first pixel including a first driving transistor, a first input transistor, a first initialization transistor, a first storage capacitor, and a first light emitting diode (LED); a second pixel including a second driving transistor, a second input transistor, a second initialization transistor, a second storage capacitor, and a second light emitting diode (LED); and a third pixel including a third driving transistor, a third input transistor, a third initialization transistor, a third storage capacitor, and a third light emitting diode (LED). The first pixel further includes a first gate electrode connecting member connecting a first gate electrode of the first driving transistor and the first input transistor; the second pixel further includes a second gate electrode connecting member connecting a second gate electrode of the second driving transistor and the second input transistor; the third pixel further includes a third gate electrode connecting member connecting a third gate electrode of the third driving transistor and the third input transistor; the first light emitting diode (LED) includes a first anode; the second light emitting diode (LED) includes a second anode; the third light emitting diode (LED) includes a third anode; the first anode and the first gate electrode connecting member overlap each other in a plan view; the second anode and the second gate electrode connecting member overlap each other in a plan view; and the third anode and the third gate electrode connecting member do not overlap each other in a plan view.

The first pixel may further include a first upper storage electrode positioned on the first gate electrode and a first lower storage electrode positioned under the first gate electrode; the second pixel may further include a second upper storage electrode disposed on the second gate electrode and a second lower storage electrode disposed under the second gate electrode; and the third pixel may further include a third upper storage electrode disposed on the third gate electrode and a third lower storage electrode disposed under the third gate electrode.

The first gate electrode may overlap the first upper storage electrode or the first lower storage electrode in a plan view; the first storage capacitor may include the first lower storage electrode, the first gate electrode, and the first upper storage electrode; the second gate electrode may overlap the second upper storage electrode or the second lower storage electrode in a plan view; the second storage capacitor may include the second lower storage electrode, the second gate electrode, and the second upper storage electrode; the third gate electrode may overlap the third upper storage electrode or the third lower storage electrode in a plan view; and the third storage capacitor may include the third lower storage electrode, the third gate electrode, and the third upper storage electrode.

The first gate electrode may have a first protruded part that does not overlap the first upper storage electrode or the first lower storage electrode in a plan view; the first protruded part may be electrically connected to the first gate electrode connecting member; the second gate electrode may have a second protruded part that does not overlap the second upper storage electrode or the second lower storage electrode in a plan view; the second protruded part may be electrically connected to the second gate electrode connecting member; the third gate electrode may have a third protruded part that does not overlap the third upper storage electrode or the third lower storage electrode in a plan view; and the third protruded part may be electrically connected to the third gate electrode connecting member.

The first gate electrode may be disposed within the boundary of the first upper storage electrode or the first lower storage electrode except for the first protruded part in a plan view; the second gate electrode may be disposed within the boundary of the second upper storage electrode or the second lower storage electrode except for the second protruded part in a plan view; and the third gate electrode may be disposed within the boundary of the third upper storage electrode or the third lower storage electrode except for the third protruded part in a plan view.

The first anode may not overlap the second gate electrode connecting member and the third gate electrode connecting member in a plan view; the second anode may not overlap the first gate electrode connecting member and the third gate electrode connecting member in a plan view; and the third anode may not overlap the first gate electrode connecting member and the second gate electrode connecting member in a plan view.

The gate electrode of the first input transistor, the gate electrode of the second input transistor, and the gate electrode of the third input transistor may be integrally formed; and the gate electrode of the first initialization transistor, the gate electrode of the second initialization transistor, and the gate electrode of the third initialization transistor may be integrally formed.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
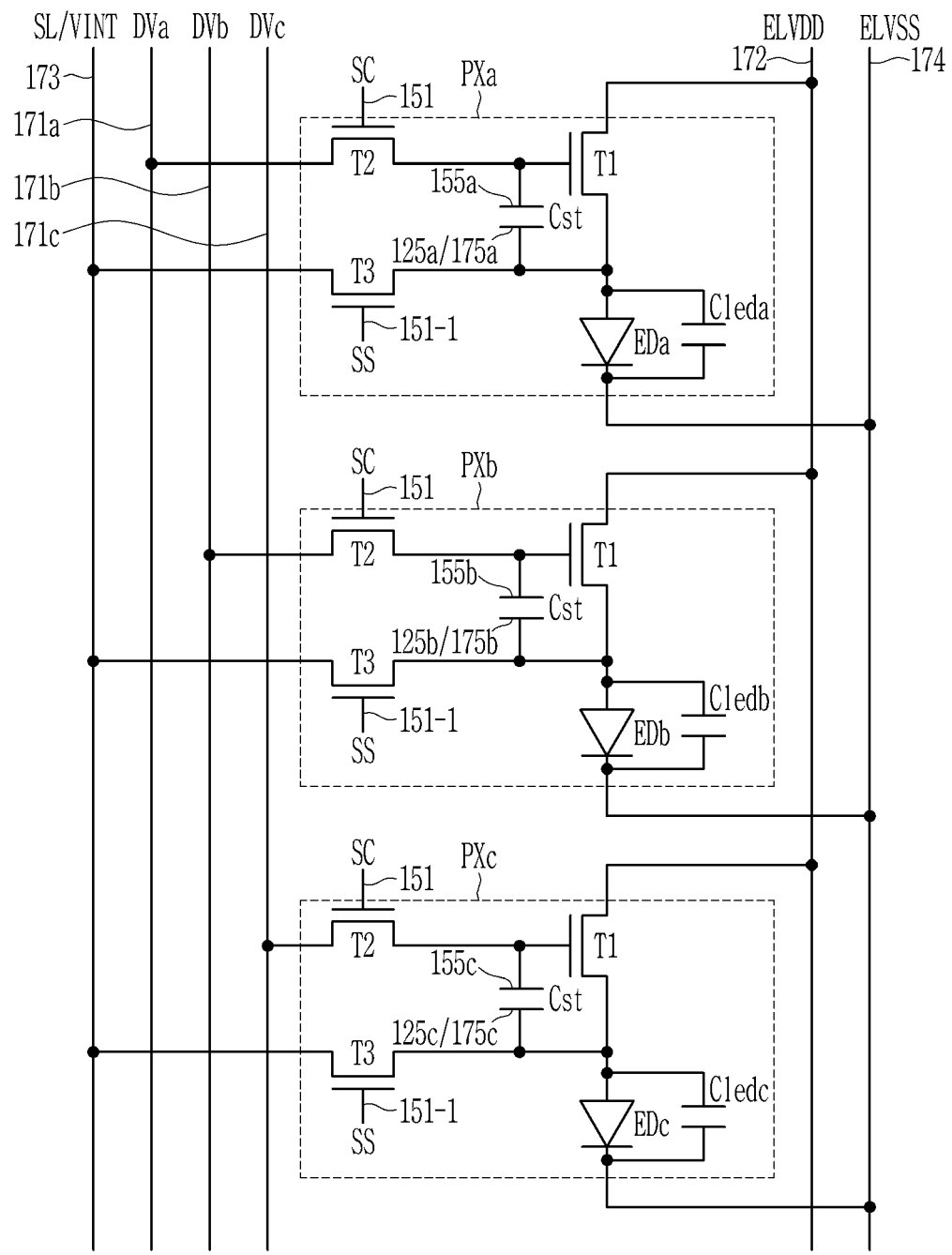
FIG. 1 is a circuit diagram of a pixel of a light emitting display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Hereinafter, an embodiment of a light emitting display device is described in detail through accompanying drawings.

FIG. 1 is a circuit diagram of a pixel of a light emitting display device according to an embodiment.

FIG. 1 shows a circuit diagram of three pixels PXa, PXb, and PXc including light emitting diodes (LED) EDa, EDb, and EDc of one group.

A plurality of pixels may include a first pixel PXa, a second pixel PXb, and a third pixel PXc. Each of the first pixel PXa, the second pixel PXb, and the third pixel PXc includes only three transistors T1, T2, and T3 and one capacitor (storage capacitor Cst for driving the light emitting diodes (LED) EDa, EDb, and EDc, so that the display device has high resolution by reducing an area occupied by one pixel. According to an embodiment, emission part capacitors Cleda, Cledb, and Cledc may be further included at both terminals of the light emitting diodes (LED) EDa, EDb, and EDc.

The light emitting diodes (LED) EDa, EDb, and EDc and the emission part capacitors Cleda, Cledb, and Cledc may be formed while three transistors T1, T2, and T3 and one capacitor (a storage capacitor Cst) are overlapped, thereby the area occupied by one pixel is not increased.

In detail, each of the first pixel PXa, the second pixel PXb, and the third pixel PXc includes a plurality of transistors T1, T2, and T3, the storage capacitor Cst, and the light emitting diodes (LED) EDa, EDb, and EDc of light-emitting elements. Here, one of pixels PXa, PXb, and PXc may be divided into the light emitting diodes (LED) EDa, EDb, and EDc and a pixel circuit unit, and the pixel circuit unit may include a plurality of transistors T1, T2, and T3 and the storage capacitor Cst in FIG. 1. Also, according to an embodiment, the capacitors Cleda, Cledb, and Cledc (hereinafter; referred to as emission part capacitors) connected to both terminals of the light emitting diodes (LED) EDa, EDb, and EDc, and the emission part capacitors Cleda, Cledb, and Cledc may not be included in the pixel circuit unit and may be included in the light emitting diodes (LED) EDa, EDb, and EDc.

A plurality of transistors T1, T2, and T3 include one driving transistor T1 (referred to as a first transistor) and two switching transistors T2 and T3, and the two switching transistors are divided into an input transistor T2 (referred to as a second transistor) and an initialization transistor T3 (referred to as a third transistor). Each transistor T1, T2, and T3 includes a gate electrode, a first electrode, and a second electrode, and also includes a semiconductor layer having a channel so that a current flows to or is blocked from the channel of the semiconductor layer depending on a voltage of the gate electrode. According to an embodiment, the first electrode and the second electrode may be disposed on respective sides of the channel of the semiconductor layer. In addition, for the first electrode and the second electrode, one of the two electrodes may be a source electrode and the other may be a drain electrode depending on the voltage applied to each transistor T1, T2, and T3.

The gate electrode of the driving transistor T1 is connected to one terminal of the storage capacitor Cst and is also connected to the second electrode (an output electrode) of the input transistor T2. Also, the first electrode of the driving transistor T1 is connected to a driving voltage line 172 transmitting a driving voltage ELVDD, the second electrode of the driving transistor T1 is connected to the anode of the light emitting diodes (LED) EDa, EDb, and EDc, the other terminal of the storage capacitor Cst, the first electrode of the third transistor T3, and one terminal of the emission part capacitors Cleda, Cledb, and Cledc. Here, a sum of connecting members (referring to connecting members 176a, 176b, and 176c of the gate electrodes of FIG. 2) connecting the gate electrode of the driving transistor T1, one terminal of the storage capacitor Cst connected thereto, the second electrode (an output electrode) of the input transistor T2, and the gate electrode of the driving transistor T1 are referred to as a gate node. Also, a sum of the second electrode of the driving transistor T1, the anode of the light emitting diodes (LED) EDa, EDb, and EDc connected thereto, and the other terminal of the storage capacitor Cst and the first electrode of the third transistor T3 is referred to as an anode node. The anode node may include one terminal of the emission part capacitors Cleda, Cledb, and Cledc. The gate node and the anode node include a part electrically connected to the gate electrode of the driving transistor T1 and the anode of the light emitting diodes (LED) EDa, EDb, and EDc and having the same voltage level, respectively. In determining the gate node and the anode node, whether being electrically connected to or not includes being integrally formed or being directly connected through an opening, and being connected while passing through the channel of the semiconductor may not be included.

The driving transistor T1 may receive the data voltages DVa, DVb, and DVc through the gate electrode depending on the switching of the input transistor T2, and may supply the driving current to the light emitting diodes (LED) EDa, EDb, and EDc depending on the voltage of the gate electrode. At this time, the storage capacitor Cst stores and maintains the voltage of the gate electrode of the driving transistor T1.

The gate electrode of the input transistor T2 is connected to the first scan signal line 151 that transmits the first scan signal SC. The first electrode of the input transistor T2 is connected to the data lines 171a, 171b, and 171c that transmit the data voltages DVa, DVb, and DVc, and the second electrode of the input transistor T2 is connected to one terminal of the storage capacitor Cst and the gate electrode of the driving transistor T1. A plurality of data lines 171a, 171b, and 171c each transmit different data voltages DVa, DVb, and DVc, and the input transistor T2 of each pixel PXa, PXb, and PXc is connected to different data lines 171a, 171b, and 171c. The gate electrode of the input transistor T2 of each pixel PXa, PXb, and PXc is connected to the same first scan signal line 151 to receive the first scan signal SC at the same timing. Even if the input transistor T2 of each pixel PXa, PXb, and PXc is turned on simultaneously by the first scan signal SC at the same timing, the different data voltages DVa, DVb, and DVc are transmitted to the gate electrode of driving transistor T1 and one terminal of storage capacitor Cst of each pixel PXa, PXb, and PXc through the different data lines 171a, 171b, and 171c.

The embodiment of FIG. 1 is an embodiment in which the gate electrode of the initialization transistor T3 receives the different scan signal from the gate electrode of the input transistor T2.

The gate electrode of the initialization transistor T3 is connected to the second scan signal line 151-1 that transmits the second scan signal SS. The first electrode of the initialization transistor T3 is connected to the other terminal of the storage capacitor Cst, the second electrode of the driving transistor T1, the anode of the light emitting diodes (LED) EDa, EDb, and EDc, and one terminal of the emission part capacitors Cleda, Cledb, and Cledc, and the second electrode of the initialization transistor T3 is connected to the initialization voltage line 173 transmitting the initialization voltage VINT. The initialization transistor T3 is turned on depending on the second scan signal SS to transmit the initialization voltage VINT to the anode of the light emitting diodes (LED) EDa, EDb, and EDc, one terminal of the emission part capacitors Cleda, Cledb, and Cledc, and the other terminal of the storage capacitor Cst, thereby initializing the voltage of the anode of the light emitting diodes (LED) EDa, EDb, and EDc.

The initialization voltage line 173 may perform an operation to sense the voltage of the anode of the light emitting diodes (LED) EDa, EDb, and EDc before applying the initialization voltage VINT, thereby serving as a sensing wire SL. Through the sensing operation, it is possible to check whether the voltage of the anode is maintained as a target voltage. The sensing operation and the initialization operation that transmits the initialization voltage VINT may be performed in a temporal division, and the initialization operation may be performed after the sensing operation is performed.

In the embodiment of FIG. 1, the turn-on section of the initialization transistor T3 and the input transistor T2 may be distinguished, so that the writing operation performed by the input transistor T2 and the initialization operation (and/or the sensing operation) performed by the initialization transistor T3 may be performed at different timings.

One terminal of the storage capacitor Cst is connected to the gate electrode of the driving transistor T1 and the second electrode of the input transistor T2, and the other terminal is connected to the first electrode of the initialization transistor T3, the second electrode of the driving transistor T1, the anode of the light emitting diodes (LED) EDa, EDb, and EDc, and one terminal of the emission part capacitors Cleda, Cledb, and Cledc. In FIG. 1, the reference numerals are shown on one terminal and the other terminal of the storage capacitor Cst, in which it is shown to clearly indicate whether any part corresponds to the storage capacitor Cst in FIG. 2, etc. Briefly, one terminal of storage capacitor Cst is integrally formed with the gate electrodes 155a, 155b, and 155c of the driving transistor T1, and the other terminal of the storage capacitor Cst is disposed on the lower storage electrodes 125a, 125b, and 125c and the upper storage electrodes 175a, 175b, and 175c. Referring to FIG. 3, in the cross-sectional structure of the storage capacitor Cst, the lower storage electrodes 125a, 125b, and 125c are positioned at the bottom, the gate electrodes 155a, 155b, and 155c of the driving transistor T1 are disposed thereon to be insulated therefrom, and the upper storage electrodes 175a, 175b, and 175c are disposed thereon to be insulated therefrom.

The insulating layers 120, 140, and 160 positioned between these three layers serve as dielectric layers, and the lower storage electrodes 125a, 125b, and 125c and the upper storage electrodes 175a, 175b, and 175c are electrically connected to each other and thus, may have the same voltage.

The cathode of the light emitting diodes (LED) EDa, EDb, and EDc receives the driving low voltage ELVSS through the driving low voltage line 174, and the light emitting diodes (LED) EDa, EDb, and EDc emits light depending on the output current of the driving transistor T1, thereby displaying a gray.

In addition, the emission part capacitors Cleda, Cledb, and Cledc are formed at both ends of light emitting diodes (LED) EDa, EDb, and EDc, so that the voltage at both ends of the light emitting diodes (LED) EDa, EDb, and EDc may be kept constant and then the light emitting diodes (LED) EDa, EDb, and EDc may display a constant luminance.

Hereinafter, the operation of the pixel having the same circuit as FIG. 1 is simply described.

FIG. 1 is an embodiment in which each transistor T1, T2, and T3 is an N-type transistor, so it turns on when a high-level voltage is applied to the gate electrode. However, according to an embodiment, each transistor T1, T2, and T3 may be a P-type transistor.

One frame begins when a light emission section ends. Next, the second scan signal SS of a high level is supplied and the initialization transistor T3 is turned on. When the initialization transistor T3 is turned on, the initialization operation and/or the sensing operation may be performed.

An embodiment in which both the initialization operation and the sensing operation are performed is described as follows.

The sensing operation may be performed first before the initialization operation is performed. That is, as the initialization transistor T3 is turned on, the initialization voltage line 173 performs the role of the sensing wiring SL to detect the voltage of the anode of the light emitting diodes (LED) EDa, EDb, and EDc. Through the sensing operation, it is possible to check whether the voltage of the anode is maintained at the target voltage.

Next, the initialization operation may be performed so as to change the voltage of the other terminal of the storage capacitor Cst, the second electrode of the driving transistor T1, and the anode of the light emitting diodes (LED) EDa, EDb, and EDc into the initialization voltage VINT transferred from the initialization voltage line 173, thereby performing the initialization.

As described above, the sensing operation and the initialization operation which transmits the initialization voltage VINT are performed with the temporal division, so that the pixel may perform the various operations while reducing the area occupied by the pixel by using a minimum number of the transistors. As a result, the resolution of the display panel may be improved.

Along with the initialization operation or the first scan signal SC applied at separate timing while being changed into a high level, the input transistor T2 is turned on and the writing operation is performed. That is, through the turned-on input transistor T2, the data voltages DVa, DVb, and DVc from the data lines 171a, 171b, and 171c is input to the gate electrode of the driving transistor T1 and one terminal of the storage capacitor Cst, and is stored.

The data voltages DVa, DVb, and DVc and the initialization voltage VINT are applied to both ends of the storage capacitor Cst by the initialization operation and the writing operation. In the state that the initialization transistor T3 is turned on, even if the output current is generated from the driving transistor T1, it may be externally output through the initialization transistor T3 and the initialization voltage line 173, so the output current may not be input to the light emitting diodes (LED) EDa, EDb, and EDc. Also, according to an embodiment, during the writing section in which the first scan signal SC of a high level is supplied, by applying the driving voltage ELVDD as the voltage of a low level or the driving low voltage ELVSS as the voltage of a high level, the current may not flow to the light emitting diodes (LED) EDa, EDb, and EDc.

Next, if the first scan signal SC is changed into a low level, the driving transistor T1 generates and outputs the output current by the driving voltage ELVDD of a high level applied to the driving transistor T1 and the gate voltage of the driving transistor T1 stored in the storage capacitor Cst. The output current of the driving transistor T1 is input to the light emitting diodes (LED) EDa, EDb, and EDc so that the light emission section in which the light emitting diodes (LED) EDa, EDb, and EDc emit light is performed.

The detailed structure of the pixel circuit unit among the pixels PXa, PXb, and PXc having the same circuit structure as that of FIG. 1 is described with reference to FIG. 2 and FIG. 3.

Figure 2:
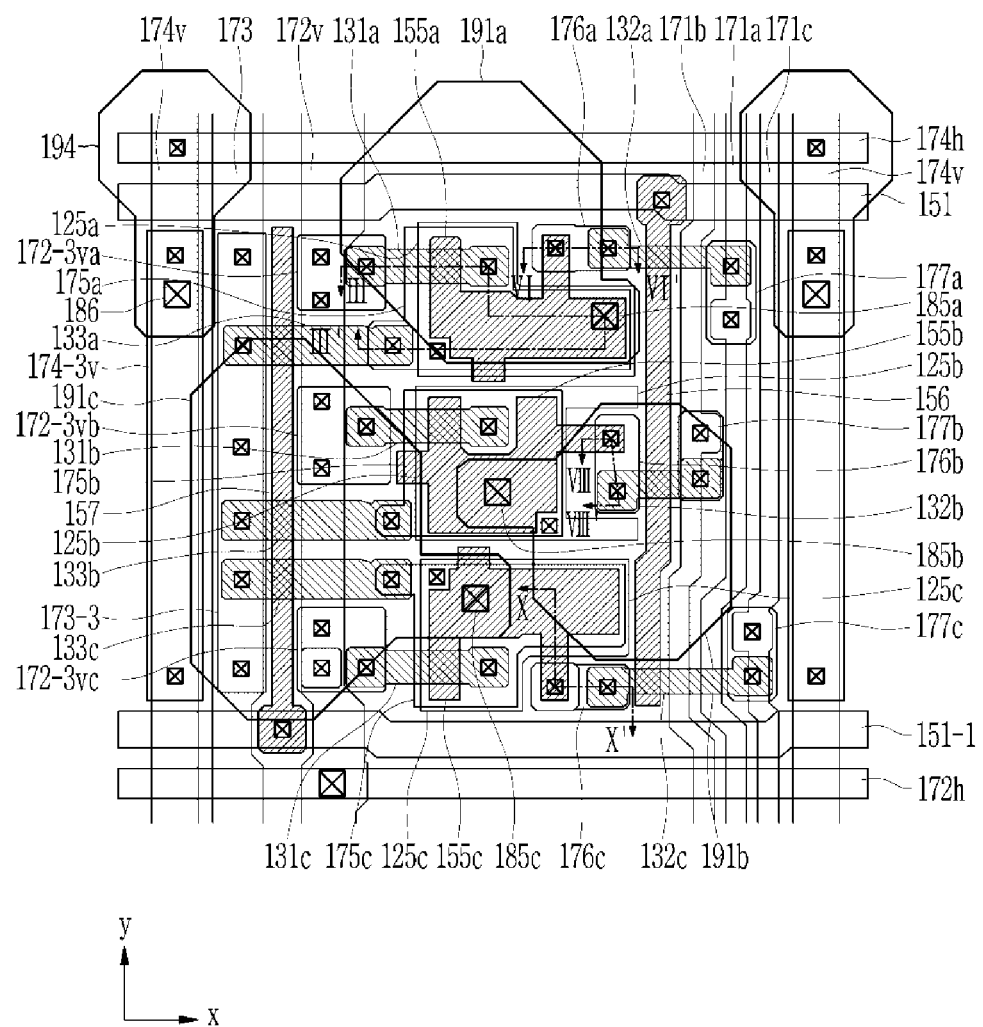
FIG. 2 is a top plan view of a part of a light emitting display device according to an embodiment.
Figure 3:
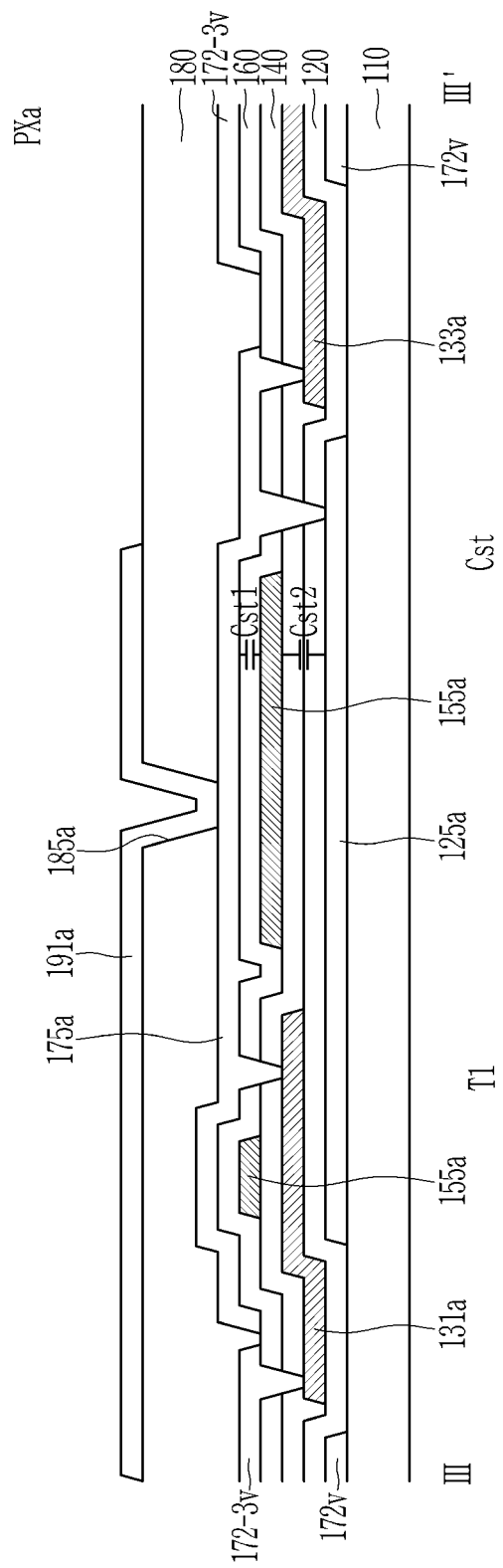
FIG. 3 is a cross-sectional view of a light emitting display device according to an embodiment taken along a line of FIG. 2.

FIG. 2 is a top plan view of a part of a light emitting display device according to an embodiment, and FIG. 3 is a cross-sectional view of a light emitting display device according to an embodiment taken along a line of FIG. 2.

FIG. 2 and FIG. 3 show the structure of the pixel circuit unit including a plurality of transistors T1, T2, and T3 and the storage capacitor Cst formed on the substrate 110, and additionally shows an anode and cathode connection part 194 of the light emitting diodes (LED) EDa, EDb, and EDc. A structure additionally formed on an anode conductive layer including the anode and cathode connection part 194 of the light emitting diode (LED) EDa, EDb, and EDc is not shown.

As shown in FIG. 2, each pixel circuit unit is arranged in a y-axis direction. Referring to FIG. 2, the first pixel circuit unit belonging to the first pixel PXa is positioned at the top, the second pixel circuit unit belonging to the second pixel PXb is positioned thereunder, and the third pixel circuit unit belonging to the third pixel PXc is positioned at the bottom. Hereinafter, the three pixels PXa, PXb, and PXc are also referred to as pixels of one group.

First, a stacked structure of the light emitting display device 10 is schematically described with reference to FIG. 2 and FIG. 3.

The light emitting display device according to an embodiment may include a substrate 110. The substrate 110 may include an insulating material, such as glass or plastic, and may have flexibility.

A first conductive layer, a first insulating layer 120, a semiconductor layer, a second insulating layer 140, a second conductive layer, a third insulating layer 160, a third conductive layer, a fourth insulating layer 180, and an anode conductive layer (or a fourth conductive layer) are sequentially formed on the substrate 110. Here, the first insulating layer 120, the second insulating layer 140, and the third insulating layer 160 may each be an inorganic insulating layer including an inorganic insulating material, and the fourth insulating layer 180 may be an organic insulating layer including an organic insulating material. According to an embodiment, each insulating layer may be formed of a plurality of layers, and according to an embodiment, the third insulating layer 160 may be an organic insulating layer. Herein, the inorganic insulating material may include a silicon nitride ($SiN_x$), a silicon oxide ($SiO_x$), and a silicon oxynitride (SiON), and the organic insulating material may include a polyimide, an acryl-based polymer, a siloxane-based polymer, and the like. In addition, the first conductive layer, the second conductive layer, and the third conductive layer may contain at least one of metals such as copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), and alloys thereof. Each of the first conductive layer, the second conductive layer, and the third conductive layer may be composed of a single layer or multiple layers. For example, the conductive layers may each have a multiple layer structure including a lower layer including titanium and an upper layer including copper. On the other hand, the fourth conductive layer (the anode conductive layer) may include the same material as the first conductive layer, the second conductive layer, and the third conductive layer to be formed of a single layer or multiple layers, and may additionally include a transparent conductive material. On the other hand, the semiconductor layer may include a semiconductor material such as amorphous silicon, polysilicon, or an oxide semiconductor. In the present embodiment, the semiconductor layer including an oxide semiconductor is mainly described.

Hereinafter, each constituent element included in the pixel circuit unit among the pixels of one group is described in detail with reference to FIG. 2 and FIG. 3.

The first scan signal line 151 is extended in the x-axis direction, is formed one by one for each pixel circuit unit of a group, and is disposed on the third conductive layer as a single layer. The second scan signal line 151-1 is also extended in the x-axis direction, is formed one-by-one for each pixel circuit unit of a group, and is disposed on the third conductive layer as a single layer. The first scan signal line 151 and the second scan signal line 151-1 may be formed of a plurality of layers, such as a double layer structure.

The first scan signal line 151 is electrically connected to the second gate electrode 156 disposed on the second conductive layer through an opening. The first scan signal SC is transmitted along the first scan signal line 151 and controls at once a plurality of input transistors T2 included in one group of the pixel circuit unit through the second gate electrode 156 electrically connected to the first scan signal line 151. According to this structure, since only one first scan signal line 151 may be formed for each pixel circuit unit of one group including three pixels, the area occupied by the pixel circuit unit may be reduced.

On the other hand, the second scan signal line 151-1 is electrically connected to the third gate electrode 157 disposed on the second conductive layer through an opening. The second scan signal SS is transmitted along the second scan signal line 151-1, and controls a plurality of initialization transistors T3 included in the pixel circuit unit of one group through the third gate electrode 157 electrically connected to the second scan signal line 151-1. According to this structure, since only one second scan signal line 151-1 may be formed for each pixel circuit unit of one group including three pixels, the area occupied by the pixel circuit unit may be reduced.

The data lines 171a, 171b, and 171c are extended in the y-axis direction, and the three data lines 171a, 171b, and 171c are all positioned on one side (a right side of FIG. 2) of the pixel circuit unit. The data lines 171a, 171b, and 171c have a single layer structure and are formed on the first conductive layer. According to an embodiment, it may be formed of a plurality of layers such as a dual layer structure.

The data lines 171a, 171b, and 171c are electrically connected to the second semiconductors 132a, 132b, and 132c through connecting members 177a, 177b, and 177c disposed on the third conductive layer, respectively. Through this structure, although three pixels PXa, PXb, and PXc belonging to one group of pixels are controlled by one first scan signal line 151, and the different data voltages DVa, DVb, and DVc may be applied through the different data lines 171a, 171b, and 171c. As a result, each of the light emitting diodes (LED) EDa, EDb, and EDc belonging to each of the pixels PXa, PXb, and PXc may display different luminance.

The driving voltage line 172 transmitting the driving voltage ELVDD may include a driving voltage line 172v extending in the y-axis direction and an additional driving voltage line 172h extending in the x-axis direction. The driving voltage ELVDD is transmitted to the mesh structure in the x-axis and y-axis directions, thereby preventing a voltage value of the driving voltage ELVDD from falling at a specific position. The additional driving voltage line 172h may be disposed on the third conductive layer. That is, the driving voltage line 172v disposed on the first conductive layer is electrically connected to the additional driving voltage line 172h positioned on the third conductive layer through an opening formed in the first insulating layer 120, the second insulating layer 140, and the third insulating layer 160.

According to an embodiment of FIG. 2, the driving voltage line 172v extending in the y-axis direction is formed of the first conductive layer and has the dual-layered structure in some section. That is, the driving voltage connection parts 172-3va, 172-3vb, and 172-3vc positioned in the third conductive layer are formed on the driving voltage line 172v positioned in the first conductive layer. The driving voltage connection parts 172-3va, 172-3vb, and 172-3vc are electrically connected to the driving voltage line 172v through an opening formed in the first insulating layer 120, the second insulating layer 140, and the third insulating layer 160, in some sections, so there is a merit that reduces wire resistance because the driving voltage ELVDD is transmitted through the double layer of the driving voltage line 172v and the driving voltage connection parts 172-3va, 172-3vb, and 172-3vc. Also, the driving voltage connection parts 172-3va, 172-3vb, and 172-3vc are electrically connected to the first semiconductors 131a, 131b, and 131c through an opening formed in the second insulating layer 140 and the third insulating layer 160. As a result, the driving voltage ELVDD is transmitted to the first semiconductors 131a, 131b, and 131c. The driving voltage connection parts 172-3va, 172-3vb, and 172-3vc of the present embodiment are formed as a total of three in the pixel of one group, but according to the embodiment, the driving voltage connection parts 172-3va, 172-3vb, and 172-3vc may be integrally formed so that only one may be formed in the pixel of one group.

The initialization voltage line 173, which transmits the initialization voltage VINT, is located on the left side of the pixel circuit unit and in the first conductive layer, and is extended in the y-axis direction. The initialization voltage line 173 of the present embodiment includes a section having a double-layered structure. That is, the initialization voltage connection part 173-3 positioned in the third conductive layer is disposed on the initialization voltage line 173 positioned in the first conductive layer. The initialization voltage connection part 173-3 is electrically connected to the initialization voltage line 173 through an opening formed in the first insulating layer 120, the second insulating layer 140, and the third insulating layer 160. In some section, the initialization voltage VINT is transmitted to the double layer of the initialization voltage line 173 and the initialization voltage connection part 173-3 so that there is a merit of reducing the wire resistance. Also, the initialization voltage connection part 173-3 is electrically connected to the third semiconductors 133a, 133b, and 133c through an opening formed in the second insulating layer 140 and the third insulating layer 160 so that the initialization voltage VINT is transmitted to the third semiconductors 133a, 133b, and 133c.

On the other hand, referring to the embodiment of FIG. 2, the driving low voltage line 174 transmitting the driving low voltage ELVSS applied to the cathode (referring to 270 of FIG. 12) of the light emitting diodes (LED) EDa, EDb, and EDc is formed in the pixel circuit unit.

The driving low voltage line 174 transmitting the driving low voltage ELVSS may include the driving low voltage line 174v extending in the y-axis direction and the additional driving low voltage line 174h extending in the x-axis direction. The driving low voltage line 174v positioned in the first conductive layer is electrically connected to the additional driving low voltage line 174h positioned in the third conductive layer through an opening formed in the first insulating layer 120, the second insulating layer 140, and the third insulating layer 160. The driving low voltage ELVSS is transmitted with such a mesh structure in the x-axis and y-axis directions, thereby preventing the voltage value of the driving low voltage ELVSS from falling at the specific position.

Also, the additional driving low voltage line 174h positioned in the third conductive layer is electrically connected to the cathode connection part 194 positioned in the fourth conductive layer (the anode conductive layer) by an opening 186 positioned in the fourth insulating layer 180. The driving low voltage ELVSS is transmitted to the cathode (referring to 270 of FIG. 12) of the light emitting diode (LED) EDa, EDb, and EDc through the cathode connection part 194.

On the other hand, referring to FIG. 1, the driving low voltage ELVSS may also be applied to one side electrode of the emission part capacitor.

A plurality of transistors T1, T2, and T3 have the same stacked structure and include the gate electrode positioned in the second conductive layer, the channel positioned in the semiconductor layer, and the first region and the second region positioned on respective sides of the channel and having the same or similar characteristic to a conductor through doping. Here, the first region and the second region positioned in the semiconductor layer may correspond to the first electrode and the second electrode described in FIG. 1.

Specifically, each transistor is described as follows.

The driving transistor T1 has the channel, the first region, and the second region in the first semiconductors 131a, 131b, and 131c disposed on the first insulating layer 120, and the first region and the second region have the same or similar characteristic to a conductor through doping. The first region of the first semiconductors 131a, 131b, and 131c is electrically connected to the driving voltage line 172v through the opening and the driving voltage connection parts 172-3va, 172-3vb, and 172-3vc to receive the driving voltage ELVDD. In detail, the driving voltage line 172v is connected to the driving voltage connection parts 172-3va, 172-3vb, and 172-3vc through the opening formed in the first insulating layer 120, the second insulating layer 140, and the third insulating layer 160, and the driving voltage connection parts 172-3va, 172-3vb, and 172-3vc are electrically connected to the first semiconductors 131a, 131b, and 131c through the opening formed in the second insulating layer 140 and the third insulating layer 160. On the other hand, the second region of the first semiconductor 131a, 131b, and 131c is electrically connected to the upper storage electrodes 175a, 175b, and 175c through the opening formed in the second insulating layer 140 and the third insulating layer 160. On the other hand, the upper storage electrodes 175a, 175b, and 175c are electrically connected to the lower storage electrodes 125a, 125b, and 125c through an opening formed in the first insulating layer 120, the second insulating layer 140, and the third insulating layer 160, and are also electrically connected to the third semiconductor 133a, 133b, and 133c through an opening formed in the second insulating layer 140 and the third insulating layer 160. As a result, the first semiconductors 131a, 131b, and 131c are electrically connected to the first region of the lower storage electrodes 125a, 125b, and 125c and the third semiconductors 133a, 133b, and 133c.

The first semiconductors 131a, 131b, and 131c are covered by the second insulating layer 140, and the gate electrodes 155a, 155b, and 155c are formed on the second insulating layer 140. In a plan view, the channel is formed in the first semiconductors 131a, 131b, and 131c overlapping the gate electrodes 155a, 155b, and 155c, and the channel is covered by the gate electrodes 155a, 155b, and 155c, thereby not being doped. The gate electrodes 155a, 155b, and 155c have a protruded part, and the protruded part is electrically connected to the second semiconductors 132a, 132b, and 132c through the opening and the gate electrode connecting members 176a, 176b, and 176c. In detail, the protruded part of the gate electrodes 155a, 155b, and 155c disposed in the second conductive layer is electrically connected to the gate electrode connecting members 176a, 176b, and 176c disposed in the third conductive layer through the opening formed in the third insulating layer 160, and the gate electrode connecting members 176a, 176b, and 176c are electrically connected to the second semiconductors 132a, 132b, and 132c through the opening formed in the second insulating layer 140 and the third insulating layer 160.

According to the embodiment of FIG. 2, three gate electrodes 155a, 155b, and 155c included in three pixels PXa, PXb, and PXc may have different plane structures from each other.

According to the embodiment of FIG. 2, in three gate electrodes 155a, 155b, and 155c, the protruded parts are differently positioned. That is, the protruded part of the gate electrode 155a of the driving transistor T1 of the first pixel PXa is protruded upward to have the structure electrically connected to the second semiconductor 132a; the protruded part of the gate electrode 155b of the driving transistor T1 of the second pixel PXb is protruded in the x-axis direction on the center to have the structure electrically connected to the second semiconductor 132b; and the protruded part of the gate electrode 155c of the driving transistor T1 of the third pixel PXc is protruded downward to have the structure electrically connected to the second semiconductor 132c.

Also, referring to FIG. 2, the interval between the connecting members 177a, 177b, and 177c of the three pixels has the characteristic that it is formed as large as possible, and the arrangement of the second semiconductors 132a, 132b, and 132c has the structure that it is formed as large as possible. The second semiconductor 132a included in the first pixel PXa is positioned at the top; the second semiconductor 132c included in the third pixel PXc is positioned at the bottom; and the second semiconductor 132b included in the second pixel PXb is disposed at the center. Thus, three gate electrode connecting members 176a, 176b, and 176c are configured to be formed as far apart as possible. In this way, according to the structure in which the second semiconductors 132a, 132b, and 132c to which the data voltages DVa, DVb, and DVc are applied are positioned far apart from each other, so when the data voltages DVa, DVb, and DVc are input to each pixel PXa, PXb, and PXc at the same timing, they affect each other less so that sufficient voltage may be input to the storage capacitor Cst. Particularly, this phenomenon may have a greater effect when the difference in the data voltages DVa, DVb, and DVc input to each pixel PXa, PXb, and PXc is large and, as shown in FIG. 2, this effect may be minimized by positioning the second semiconductors 132a and 132c of the first pixel PXa and the third pixel PXc as far apart as possible.

In addition, in the first pixel PXa and the second pixel PXb, the gate electrodes 155a and 155b have the structure that protrudes upward to overlap with the first semiconductors 131a and 131b, but in the third pixel PXc, the gate electrode 155c has a structure that protrudes downwards to overlap with the first semiconductor 131c.

The detailed structure of each gate electrode 155a, 155b, and 155c is described as follows.

The gate electrode 155a of the driving transistor T1 of the first pixel PXa includes a part overlapping with the first semiconductor 131a and a part extending therefrom to form the other electrode of the storage capacitor Cst while overlapping with the lower storage electrode 125a and the upper storage electrode 175a. In addition, the gate electrode 155a of the driving transistor T1 of the first pixel PXa further includes a protruded part to be protruded and electrically connected to the gate electrode connecting member 176a through an opening formed in the third insulating layer 160. Also, the gate electrode 155a may have a removed part so that the second region of the first semiconductor 131a is electrically connected to the upper storage electrode 175a through an opening formed in the second insulating layer 140 and the third insulating layer 160. Also, the gate electrode 155a may have a removed part so that the upper storage electrode 175a is electrically connected to the lower storage electrode 125a through an opening formed in the first insulating layer 120, the second insulating layer 140, and the third insulating layer 160.

Here, the boundary line of the gate electrode 155a of the driving transistor T1 of the first pixel PXa may be positioned further inside in a plan view than the boundary line of the lower storage electrode 125a and/or the boundary line of the upper storage electrode 175a overlapping with the protruded part. As a result, the gate electrode 155a of the driving transistor T1 of the first pixel PXa may have the structure protected by the lower storage electrode 125a and/or the upper storage electrode 175a, thereby forming a relatively small parasitic capacitance with the adjacent pixel PXb. This is because the gate electrode 155a of the driving transistor T1 of the first pixel PXa is covered by the lower storage electrode 125a and/or the upper storage electrode 175a, which are positioned above and below, such that most of the generated power line is connected to the lower storage electrode 125a and/or the upper storage electrode 175a before entering the gate electrode 155a.

The gate electrode 155b of the driving transistor T1 of the second pixel PXb includes a part overlapping with the first semiconductor 131b and a part extending therefrom and configuring the other electrode of the storage capacitor Cst while overlapping with the lower storage electrode 125b and the upper storage electrode 175b. Also, the gate electrode 155b of the driving transistor T1 of the second pixel PXb further includes a protruded part protruded to be electrically connected to the gate electrode connecting member 176b through an opening formed in the third insulating layer 160.

Further, the gate electrode 155b may include a removed part so that the second region of the first semiconductor 131b is electrically connected to the upper storage electrode 175b through an opening formed in the second insulating layer 140 and the third insulating layer 160. In addition, the gate electrode 155b may have a removed part so that the upper storage electrode 175b is electrically connected to the lower storage electrode 125b through an opening formed in the first insulating layer 120, the second insulating layer 140, and the third insulating layer 160.

Here, the boundary line of the gate electrode 155a of the driving transistor T1 of the second pixel PXb may be positioned further inside in a plan view than the boundary line of the lower storage electrode 125b and/or the boundary line of the upper storage electrode 175b overlapping with the protruded part. As a result, the gate electrode 155b of the driving transistor T1 of the second pixel PXb forms a relatively small parasitic capacitance with the adjacent pixel PXa and PXc. This is because most of the generated power line is connected to the lower storage electrode 125b and/or the upper storage electrode 175b before entering the gate electrode 155b.

The gate electrode 155c of the driving transistor T1 of the third pixel PXc includes a part overlapping with the first semiconductor 131c and a part extending therefrom to form the other electrode of the storage capacitor Cst while overlapping the lower storage electrode 125c and the upper storage electrode 175c. In addition, the gate electrode 155c of the driving transistor T1 of the third pixel PXc further includes a protruded part protruding to be electrically connected to the gate electrode connecting member 176c through an opening formed in the third insulating layer 160. In addition, the gate electrode 155c may have a removed part so that the second region of the first semiconductor 131c is electrically connected to the upper storage electrode 175c through an opening formed in the second insulating layer 140 and the third insulating layer 160. In addition, the gate electrode 155c may have a removed part so that the upper storage electrode 175c is electrically connected to the lower storage electrode 125c through an opening formed in the first insulating layer 120, the second insulating layer 140, and the third insulating layer 160.

Here, the boundary line of the gate electrode 155c of the driving transistor T1 of the third pixel PXc may be positioned further inside in a plan view than the boundary line of the lower storage electrode 125c and/or the boundary line of the upper storage electrode 175c overlapping with the protruded part. As a result, the gate electrode 155c of the driving transistor T1 of the third pixel PXc forms relatively little parasitic capacitance with the adjacent pixel PXb. This is because most of the generated power lines are connected to the lower storage electrode 125c and/or the upper storage electrode 175c before entering the gate electrode 155c.

On the other hand, according to an embodiment, some part in addition to the protruded part of the gate electrodes 155a, 155b, and 155c may be positioned outside the boundary of the lower storage electrodes 125a, 125b, and 125c and/or the upper storage electrodes 175a, 175b, and 175c. That is, according to FIG. 2, the gate electrodes 155a and 155c of the first pixel PXa, the second pixel PXbc, and the third pixel PXc may further include an additional protruded part positioned further outside than the boundaries of the lower storage electrodes 125a, 125b, and 125c and the upper storage electrodes 175a, 175b, and 175c. That is, the gate electrode 155a of the first pixel PXa further includes an additional protruded part protruded downward; the gate electrode 155b of the second pixel PXb further includes an additional protruded part extending in the x-axis direction; and the gate electrode 155c of the third pixel PXc further includes an additional protruded part protruded upward. The structure of this additional protruded part may function to make the capacitance value of the storage capacitor Cst constant. In other words, when the gate electrodes 155a, 155b, and 155c are actually formed, if they are formed while moving to one side, the area overlapping with the lower storage electrodes 125a, 125b, and 125c and/or the upper storage electrodes 175a, 175b, and 175c is changed and then the capacitance value of the storage capacitor Cst may be changed. However, if a part of the gate electrodes 155a, 155b, and 155c is formed outside the lower storage electrodes 125a, 125b, and 125c and/or the upper storage electrodes 175a, 175b, and 175c, even if the gate electrodes 155a, 155b, and 155c are formed while moving to one side, the area overlapping with the lower storage electrodes 125a, 125b, and 125c and/or the upper storage electrodes 175a, 175b, and 175c may be made constant.

On the other hand, according to FIG. 2, the lower storage electrodes 125a, 125b, and 125c may have an outer boundary extending further outward than that of the upper storage electrodes 175a, 175b, and 175c, but only in the aspect that the upper storage electrodes 175a, 175b, and 175c are connected to the third semiconductors 133a, 133b, and 133c, the boundary may be positioned further outside the lower storage electrodes 125a, 125b, and 125c.

The input transistor T2 has the channel, the first region, and the second region in the second semiconductors 132a, 132b, and 132c disposed on the first insulating layer 120, and the first region and the second region have the same or similar characteristic to a conductor through doping. The first region of the second semiconductors 132a, 132b, and 132c is electrically connected to the connecting members 177a, 177b, and 177c through an opening formed in the second insulating layer 140 and the third insulating layer 160, and the connecting members 177a, 177b, and 177c are electrically connected the data lines 171a, 171b, and 171c through an opening formed in the first insulating layer 120, the second insulating layer 140, and the third insulating layer 160, thereby receiving the data voltages DVa, DVb, and DVc. The second region of the second semiconductors 132a, 132b, and 132c is electrically connected to the gate electrode connecting members 176a, 176b, and 176c through an opening formed in the second insulating layer 140 and the third insulating layer 160, and the gate electrode connecting members 176a, 176b, and 176c are electrically connected to the gate electrodes 155a, 155b, and 155c through an opening formed in the third insulating layer 160. According to an embodiment, the gate electrode connecting members 176a, 176b, and 176c may have a structure covering the channel of the second semiconductors 132a, 132b, and 132c by extending toward the channels of the second semiconductors 132a, 132b, and 132c.

The second semiconductors 132a, 132b, and 132c are covered by the second insulating layer 140, and the second gate electrode 156 is formed on the second insulating layer 140. In a plan view, the channel is formed in the second semiconductors 132a, 132b, and 132c overlapping the second gate electrode 156, and the channel is covered by the second gate electrode 156 and is not doped. The second gate electrode 156 is extended and is electrically connected to the first scan signal line 151 positioned in the third conductive layer through an opening formed in the third insulating layer 160. In addition, the second gate electrodes 156 of a plurality of input transistors T2 belonging to one group of the pixels are integrally formed.

The connecting members 177a, 177b, and 177c that connect the first region of the second semiconductors 132a, 132b, and 132c to the data lines 171a, 171b, and 171c have a structure that reduces interference by being positioned farther away from each other within the pixel circuit unit of one group. In this way, according to the structure in which the second semiconductors 132a, 132b, and 132c to which data voltages DVa, DVb, and DVc are applied are positioned far from each other, and when the data voltages DVa, DVb, and DVc are input to each pixel PXa, PXb, and PXc at the same timing, they affect each other less so that a sufficient voltage may be input to the storage capacitor Cst. Particularly, this phenomenon may have a greater effect when the difference in the data voltages DVa, DVb, and DVc input to each pixel PXa, PXb, and PXc is large, and in the embodiment of FIG. 2, this effect is minimized by positioning as far away as possible.

The initialization transistor T3 has the channel, the first region, and the second region in the third semiconductors 133a, 133b, and 133c disposed on the first insulating layer 120, and have the same or similar characteristic to a conductor through doping. The first region of the third semiconductors 133a, 133b, and 133c is electrically connected to the upper storage electrodes 175a, 175b, and 175c positioned in the third conductive layer through an opening formed in the second insulating layer 140 and the third insulating layer 160. The upper storage electrodes 175a, 175b, and 175c are electrically connected to the lower storage electrodes 125a, 125b, and 125c through an opening formed in the first insulating layer 120, the second insulating layer 140, and the third insulating layer 160, and are also electrically connected to the first semiconductors 131a, 131b, and 131c through an opening formed in the second insulating layer 140 and the third insulating layer 160. The second region of the third semiconductors 133a, 133b, and 133c is electrically connected to the initialization voltage connection part 173-3 through an opening formed in the second insulating layer 140 and the third insulating layer 160 to receive the initialization voltage VINT. The third semiconductors 133a, 133b, and 133c are covered by the second insulating layer 140, and the third gate electrode 157 is formed on the second insulating layer 140. In a plan view, the channel is formed in the third semiconductors 133a, 133b, and 133c overlapping with the third gate electrode 157, and the channel is covered by the third gate electrode 157 and is not doped. The third gate electrode 157 is extended and electrically connected to the second scan signal line 151-1, which is positioned in the third conductive layer, through an opening formed in the third insulating layer 160. In addition, the third gate electrodes 157 of a plurality of initialization transistors T3 belonging to one group of the pixels are integrally formed.

The storage capacitor Cst, as shown in FIG. 3, includes the first storage capacitor Cst1 and the second storage capacitor Cst2.

The first storage capacitor Cst1 is composed of the gate electrodes 155a, 155b, and 155c positioned on the second conductive layer, the third insulating layer 160 positioned thereon, and the upper storage electrodes 175a, 175b, and 175c positioned thereon. In addition, the second storage capacitor Cst2 consists of the lower storage electrodes 125a, 125b, and 125c positioned in the first conductive layer, the first insulating layer 120 and the second insulating layer 140 positioned thereon, and the gate electrodes 155a, 155b, and 155c positioned thereon. As a result, they have a triple-layer structure of two storage electrodes (the upper storage electrodes 175a, 175b, and 175c and the lower storage electrodes 125a, 125b, and 125c) overlapping up and down commonly via the gate electrodes 155a, 155b, and 155c in a plan view.

The lower storage electrodes 125a, 125b, and 125c and the upper storage electrodes 175a, 175b, and 175c are electrically connected to each other through an opening formed in the first insulating layer 120, the second insulating layer 140, and the third insulating layer 160, and the gate electrodes 155a, 155b, and 155c are commonly included in the first storage capacitor Cst1 and the second storage capacitor Cst2, so the first storage capacitor Cst1 and the second storage capacitor Cst2 have a structure coupled in parallel on a circuit structure. Since the structure coupled in parallel is formed on a circuit structure, the entire capacitance of the storage capacitor Cst is the sum of the capacitance of the first storage capacitor Cst1 and the capacitance of the second storage capacitor Cst2.

The upper storage electrodes 175a, 175b, and 175c are integrally formed and electrically connected to the anodes 191a, 191b, and 191c of the light emitting diodes (LED) EDa, EDb, and EDc through openings 185a, 185b, and 185c formed in the fourth insulating layer 180. According to an embodiment, it may further include an additional member (an anode connecting member) connecting the anode to the upper storage electrodes 175a, 175b, and 175c.

The light emitting diodes (LED) EDa, EDb, and EDc include the anodes 191a, 191b, and 191c, the emission layer (referring to 370 of FIG. 12), and the cathode (referring to 270 of FIG. 12), and the anodes 191a, 191b, and 191c are disposed in the fourth conductive layer (the anode conductive layer) on the fourth insulating layer 180. In addition, a partition layer (refer to 350 in FIG. 12) may be formed to distinguish the light emitting diodes (LEDs) from each other, the partition layer 350 may have a structure in which the anodes 191a, 191b, and 191c are exposed through the openings 351, and the emission layer 370 is formed through the exposed part and the cathode 270 is formed thereon.

Figure 12:
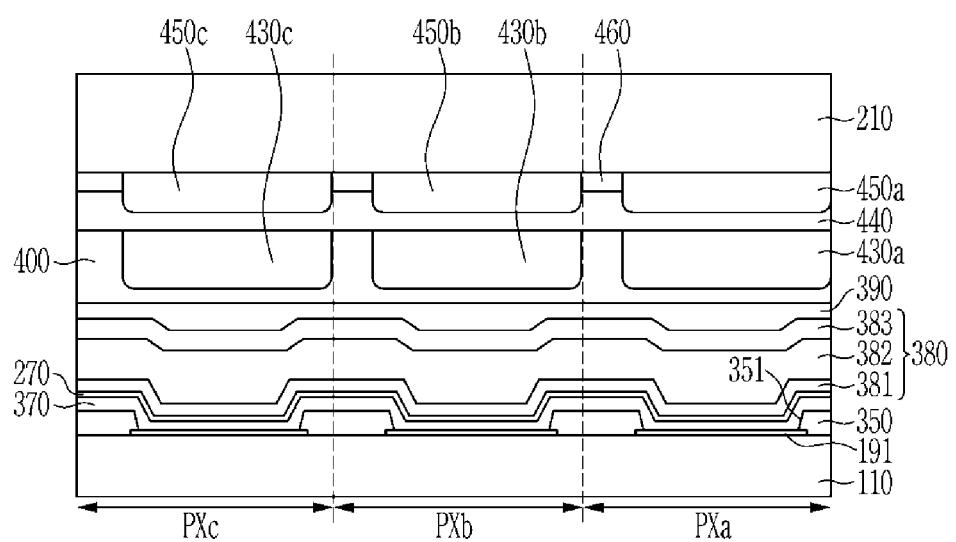
FIG. 12 is a cross-sectional view entirely showing a light emitting display device according to an embodiment.

According to the embodiment, the emission layer may be formed only within the opening of the partition layer, but according to the embodiment of FIG. 12, the emission layer 370 is also formed on the exposed anode 191 and the partition layer 350. The cathode 270 is formed on the emission layer 370. According to the embodiment of FIG. 12, the emission layer 370 and the cathode 270 may be formed entirely, thereby omitting use of a mask.

An encapsulation layer, a color conversion layer, or a color filter may be formed on the light emitting diodes (LED) EDa, EDb, and EDc, and this structure is described layer in FIG. 12.

Referring to FIG. 2, as the anodes 191a, 191b, and 191c of the light emitting diodes (LED) EDa, EDb, and EDc are formed regardless of the structure of the pixel circuit unit of each pixel PXa, PXb, and PXc, and the anodes 191a, 191b, and 191c have the structure overlapping the adjacent pixels in addition to the corresponding pixel in a plan view.

The overlapping structure of the anodes 191a, 191b, and 191c of the light emitting diodes (LED) EDa, EDb, and EDc and the corresponding pixel and adjacent pixels is described in detail with reference to FIGS. 4A and 4B to FIG. 10.

Figure 4A:
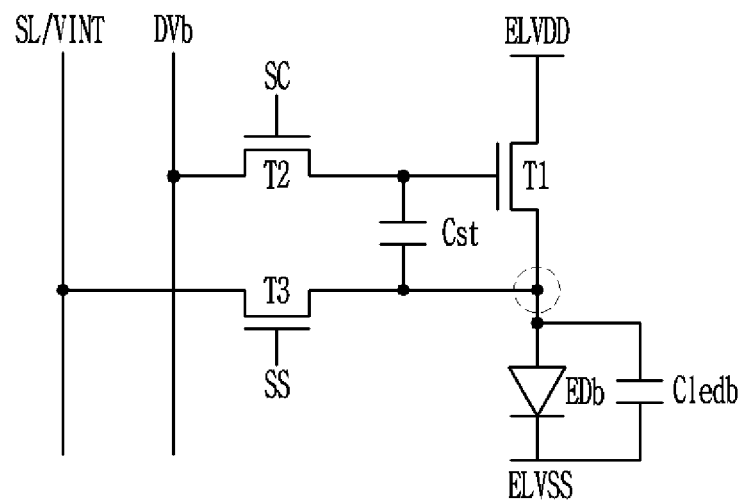
FIGS. 4A and 4B are circuit diagrams showing a relationship of an anode and a gate node of a driving transistor between adjacent pixels.
Figure 4B:
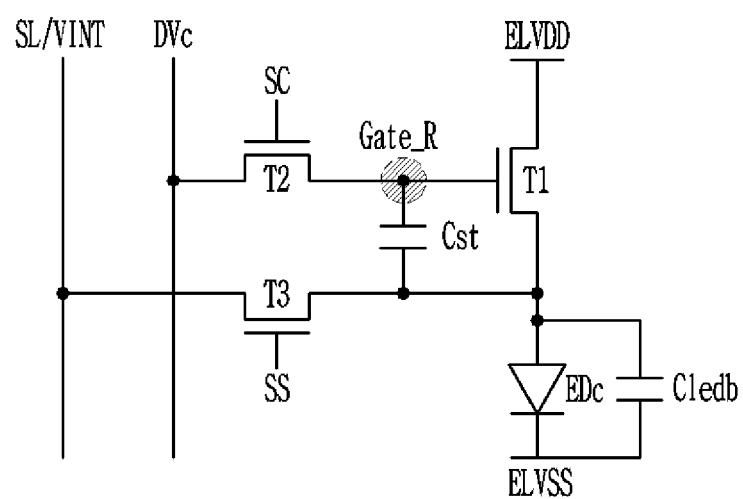

The relationship with the adjacent pixels, as shown in FIGS. 4A and 4B, is mainly imparted by the relationship between the gate node of the corresponding pixel and the anode node of the adjacent pixels, and this may be determined by the overlapping structure of the anodes 191a, 191b, and 191c of the light emitting diodes (LED) EDa, EDb, and EDc and the adjacent pixel circuit unit.

Hereinafter, the anode node and the gate node between the adjacent pixels are schematically described with reference to FIGS. 4A and 4B.

FIGS. 4A and 4B are circuit diagrams showing a relationship of an anode and a gate node of a driving transistor between adjacent pixels.

In FIGS. 4A and 4B, the second pixel PXb and the third pixel PXc are respectively illustrated, and the same relationship be applied between the second pixel PXb and the first pixel PXa.

According to FIGS. 4A and 4B, the parasitic capacitance, which is greatly affected by the adjacent pixels, occurs between the anode node Anode_B of one pixel PXc and the gate node Gate_R of the other pixel PXb.

The gate node Gate_R of the third pixel PXc includes a gate electrode connecting member 176c connecting the second semiconductor 132c of the input transistor T2 connected to the gate electrode 155c of the driving transistor T1 and the gate electrode 155c of the driving transistor T1, as well as the gate electrode 155c of the driving transistor T1. The gate node Gate_R may also include a part (a part of the second semiconductor 132c) that always has the same voltage level as the gate electrode 155c of the driving transistor T1. Referring to FIG. 2 and FIG. 3, a gate electrode connecting member 176c electrically connected to the protruded part of the gate electrode 155c through an opening formed in the third insulating layer 160 is included. A second region of the second semiconductor 132c electrically connected to the gate electrode connecting member 176c through an opening may be additionally included in the gate node.

The anode node Anode_B of the second pixel PXb includes not only the anode 191b of the light emitting diode (LED) EDb, but also the upper storage electrode 175b and the lower storage electrode 125b, which are connected thereto. Also, the anode node Anode_B may also include a part of the part (the first semiconductor 131b) always having the same voltage level as the anode 191b of the light emitting diode (LED) EDb, a part of the third semiconductor 133b, and one terminal of the emission part capacitor Cledb. Referring to FIG. 2 and FIG. 3, the upper storage electrode 175b electrically connected to the anode 191b through the opening 185b formed in the fourth insulating layer 180 and the lower storage electrode 125b electrically connected to the upper storage electrode 175b through the opening are included. The second region of the first semiconductor 131b and the first region of the third semiconductor 133b, which are additionally electrically connected to the upper storage electrode 175b through the opening, may be additionally included in the anode node.

Here, in determining the gate node and the anode node, and whether they are electrically connected to each other, includes a case that they are integrally formed or directly connected through an opening, and may not include a case that they are connected through a channel of a semiconductor.

It is appropriate that the parasitic capacitance between the anode node Anode_B of one pixel PXc and the gate node Gate_R of the other pixel PXb, which are shown in FIG. 14, is formed as small as possible. That is, if the parasitic capacitance is large, the voltage change of the anode node Anode_B of one pixel PXc affects the gate node Gate_R of the other pixel PXb, so that the output current output by the driving transistor T1 of the other pixel PXb may be changed.

The present embodiment has a structure in which the influence of the adjacent pixels is reduced by allowing the anode node of the adjacent pixels to generate less parasitic capacitance with the gate node of the corresponding pixel, and this is described with reference to FIG. 5 to FIG. 10.

The overlapping structure of the anodes 191a, 191b, and 191c of the light emitting diodes (LED) EDa, EDb, and EDc and the corresponding pixel is described with reference to FIG. 5 to FIG. 10.

Figure 5:
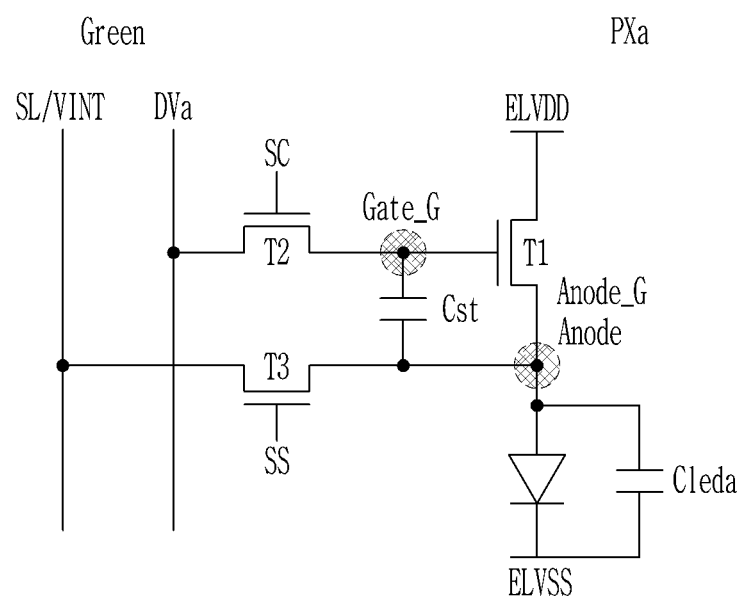
FIG. 5 is a circuit diagram showing an anode of a green pixel and a gate node of a driving transistor.
Figure 6:
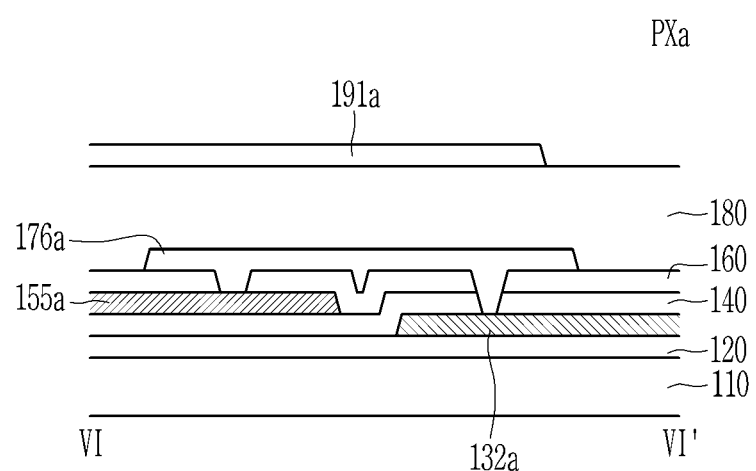
FIG. 6 is a cross-sectional view of a light emitting display device according to an embodiment taken along a line VI-VI' of FIG. 2.
Figure 7:
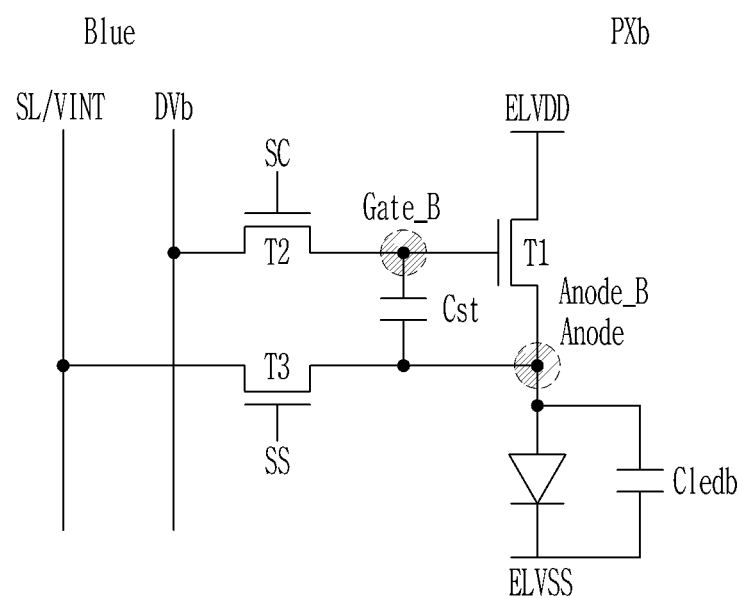
FIG. 7 is a circuit diagram showing an anode of a blue pixel and a gate node of a driving transistor.
Figure 8:
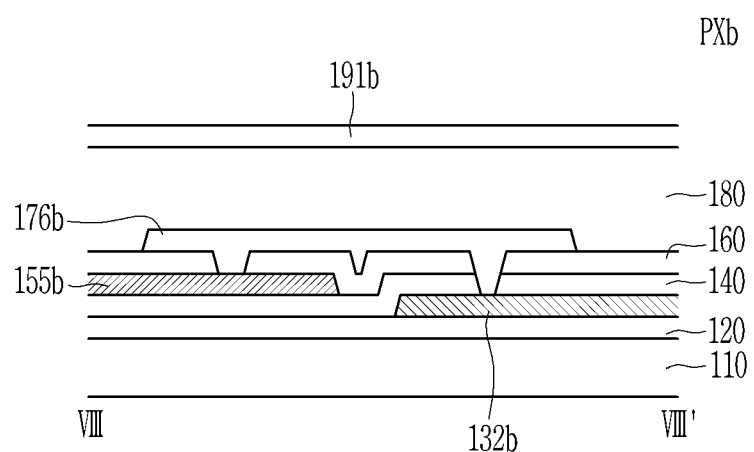
FIG. 8 is a cross-sectional view of a light emitting display device according to an embodiment taken along a line VIII-VIII' of FIG. 2.
Figure 9:
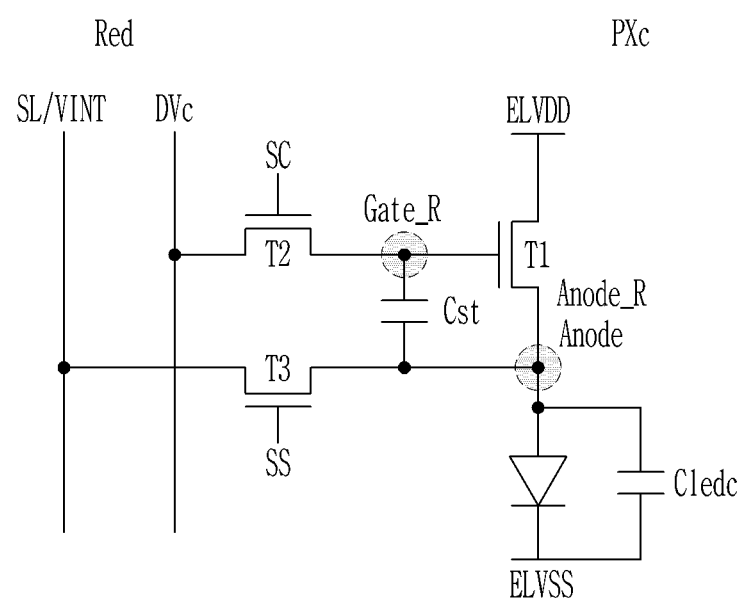
FIG. 9 is a circuit diagram showing an anode of a red pixel and a gate node of a driving transistor.
Figure 10:
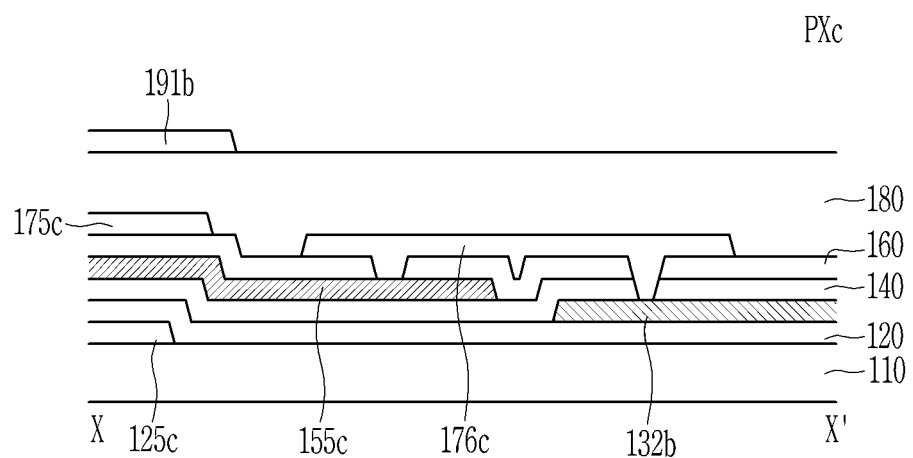
FIG. 10 is a cross-sectional view of a light emitting display device according to an embodiment taken along a line X-X' of FIG. 2.

FIG. 5 is a circuit diagram showing an anode of a green pixel and a gate node of a driving transistor; FIG. 6 is a cross-sectional view of a light emitting display device according to an embodiment taken along a line VI-VI' of FIG. 2; FIG. 7 is a circuit diagram showing an anode of a blue pixel and a gate node of a driving transistor; FIG. 8 is a cross-sectional view of a light emitting display device according to an embodiment taken along a line VIII-VIII' of FIG. 2; FIG. 9 is a circuit diagram showing an anode of a red pixel and a gate node of a driving transistor; and FIG. 10 is a cross-sectional view of a light emitting display device according to an embodiment taken along a line X-X' of FIG. 2.

Here, it is described through an embodiment in which a green pixel is the first pixel PXa, a blue pixel is the second pixel PXb, and a red pixel is the third pixel PXc. However, the inventive concepts are not so limited, and the pixels of various colors may be positioned in various positions.

FIG. 5 shows the positions of the gate node Gate_G and the anode node Anode_G of the green pixel (the first pixel PXa) on a circuit diagram.

The gate node Gate_G of the green pixel (the first pixel PXa) not only includes the gate electrode 155a of the driving transistor T1, but also the gate electrode connecting member 176a connecting the second semiconductor 132a of the input transistor T2 connected thereto and the gate electrode 155a of the driving transistor T1. The gate node Gate_G may also include a part (a part of the second semiconductor 132a) always having the same voltage level as the gate electrode 155a of the driving transistor T1.

The anode node Anode_G of the green pixel (the first pixel PXa) not only includes the anode 191a of the light emitting diode (LED) (EDa), but also the upper storage electrode 175a and the lower storage electrode 125a, which are connected thereto. The anode node Anode_G may also include a part (a part of the first semiconductor 131a, a part of the third semiconductor 133a, and one terminal of the emission part capacitor Cleda) having the same voltage level as the anode 191a of the light emitting diode (LED) EDa.

Referring to FIG. 2, it may be confirmed that the anodes 191a, 191b, and 191c mainly affect the adjacent pixels among the constituent elements included in the anode node. That is, as shown in FIG. 2, the anodes 191a, 191b, and 191c have a structure that is positioned on the pixel circuit unit of the adjacent pixels, so they substantially affect the adjacent pixels.

On the other hand, the gate electrode 155a belonging to the gate node Gate_G of the green pixel (the first pixel PXa) is covered by the upper storage electrode 175a in a plan view, so the influence from the anodes 191b and 191c of the adjacent pixels PXb and PXc is small. Therefore, the gate electrode connecting member 176a, which is located uppermost among the gate node Gate_G of the green pixel (the first pixel PXa) and is exposed, is most affected by the anodes 191b and 191c of the adjacent pixels PXb and PXc.

Therefore, the influence of the gate node Gate_G of the green pixel (the first pixel PXa) by the adjacent anode node may be confirmed based on adjacent information of the anode 191b and 191c of the adjacent pixels PXb and PXc and the gate electrode connecting member of the green pixel (the first pixel PXa). Particularly, when the anodes 191b and 191c of the adjacent pixels PXb and PXc and the gate electrode connecting member of the green pixel (the first pixel PXa) have the overlapping structure in a plan view, the driving transistor T1 of the corresponding pixel PXa may not output the target output current due to a large influence on the gate node Gate_G of the corresponding pixel from the anode node of the adjacent pixels PXb and PXc.

Referring to FIG. 2, since the anodes 191b and 191c of the pixels PXb and PXc adjacent to each other and the gate electrode 155a and the gate electrode connecting member 176a of the green pixel (the first pixel PXa) are overlapped with each other in a plan view, it may be confirmed that the anodes 191b and 191c of the adjacent pixels PXb and PXc and the gate electrode 155a and the gate electrode connecting member 176a of the green pixel (the first pixel PXa) are formed while maintaining a certain distance. As described above, since they do not overlap each other in a plan view, the gate node Gate_G of the corresponding pixel PXa from the anode node of the adjacent pixels PXb and PXc is less affected, and the driving transistor T1 of the corresponding pixel PXa may output the target output current.

Referring to FIG. 6, the structure in which the gate electrode connecting member 176a of the gate node Gate_G and the anode 191a of the anode node Anode_G overlap each other in a cross-section in the green pixel (the first pixel PXa) is shown. That is, in the green pixel (the first pixel PXa), the gate electrode connecting member 176a of the gate node Gate_G has a structure that is protected by the anode 191a while being overlapped. As a result, the structure in which the anodes 191b and 191c of the adjacent pixels PXb and PXc do not overlap vertically and the influence on the side through the electric field is blocked to a certain level is formed.

As above-described, by the structure in which the gate electrode 155a and the gate electrode connecting member 176a of the gate node Gate_G do not overlap the anodes 191b and 191c of the adjacent pixels PXb and PXc in the green pixel (the first pixel PXa) and overlap the anode 191a of the corresponding pixel PXa, the influence from the anode nodes Anode_B and Anode_R of the adjacent pixels PXb and PXc may be minimized so that the driving transistor T1 of the corresponding pixel PXa may output the target output current and then the light emitting diode (LED) Eda of the corresponding pixel PXa may display the target luminance.

On the other hand, referring to FIG. 6, the gate node Gate_G of the green pixel (the first pixel PXa) and the anode node Anode_G overlap each other, but they are formed on the same pixel (the first pixel PXa), which ultimately maintains the target voltage and does not affect the display quality.

Next, the gate node Gate_B and the anode node Anode_B of the blue pixel (the second pixel PXb) is described with reference to FIG. 7 and FIG. 8.

The gate node Gate_B of the blue pixel (the second pixel PXb) not only includes the gate electrode 155b of the driving transistor T1, but also the gate electrode connecting member 176b that connects the second semiconductor 132b of the input transistor T2 and the gate electrode 155b of the driving transistor T1. The gate node Gate_B may also include a part (a part of the second semiconductor 132b) always having the same voltage level as the gate electrode 155b of the driving transistor T1.

The anode node Anode_B of the blue pixel (the second pixel PXb) includes the anode 191b of the light emitting diode (LED) (EDb) as well as the upper storage electrode 175b and the lower storage electrode 125b connected thereto. The anode node Anode_B may also include a part (a part of the first semiconductor 131b, a part of the third semiconductor 133b, and one terminal of the emission part capacitor Cledb) always having the same voltage level as the anode 191b of the light emitting diode (LED) EDb.

Referring to FIG. 2, it may be confirmed that the anodes 191a, 191b, and 191c among the constituent elements included in the anode node mainly affect the adjacent pixels. That is, as shown in FIG. 2, the anodes 191a, 191b, and 191c have a structure that is positioned on the pixel circuit unit of the adjacent pixels, so they substantially affect adjacent pixels.

On the other hand, the gate electrode 155b, which belongs to the gate node Gate_B of the blue pixel (the second pixel PXb), is covered by the upper storage electrode 175b in a plan view and the influence imparted by the anodes 191a and 191c of the adjacent pixels PXa and PXc is small. Therefore, the gate electrode connecting member 176b, which is positioned uppermost among the gate node Gate_B of the blue pixel (the second pixel PXb) and exposed, is most affected by the anodes 191a and 191c of the adjacent pixels PXa and PXc.

Therefore, the influence of the gate node Gate_B of the blue pixel (the second pixel PXb) by the adjacent anode node may be confirmed based on the adjacent information of the anodes 191a and 191c of the adjacent pixels PXa and PXc and the gate electrode connecting member 176b of the blue pixel (the second pixel PXb). Particularly, when the anodes 191a and 191c of the adjacent pixels PXa and PXc and the gate electrode connecting member 176b of the blue pixel (the second pixel PXb) have the overlapping structure in a plan view, the driving transistor T1 of the corresponding pixel PXb may not output the target output current due to a large influence on the gate node Gate_B of the corresponding pixel PXb from the anode node of the adjacent pixels PXa and PXc.

Referring to FIG. 2, the anodes 191a and 191c of the adjacent pixels PXa and PXc and the gate electrode 155b and the gate electrode connecting member 176b of the blue pixel (the second pixel PXb) do not overlap in a plan view, so it may be confirmed that the anodes 191a and 191c of the adjacent pixels PXa and PXc and the gate electrode 155b and the gate electrode connecting member 176b of the blue pixel (the second pixel PXb) are formed while maintaining a certain interval. As described above, since they do not overlap each other in a plan view, the gate node Gate_B of the corresponding pixel PXb from the anode node of the adjacent pixels PXa and PXc is less affected, and the driving transistor T1 of the corresponding pixel PXb may output the target output current.

Also, referring to FIG. 8, the structure in which the gate electrode connecting member 176b of the gate node Gate_B and the anode 191b of the anode node Anode_B are overlapped to each other on a cross-section in the blue pixel (the second pixel PXb) is shown. That is, in the blue pixel (the second pixel PXb), the gate electrode connecting member 176b of the gate node Gate_B is protected by the anode 191b while being overlapped. As a result, the structure in which the anodes 191a and 191c of the adjacent pixels PXa and PXc do not overlap vertically and the influence on the side through the electric field is blocked to a certain level is formed.

As above-described, by the structure in which the gate electrode 155b and the gate electrode connecting member 176b of the gate node Gate_B do not overlap the anodes 191a and 191c of the adjacent pixels PXa and PXc in the blue pixel (the second pixel PXb) and overlap the anode 191b of the corresponding pixel PXb, the influence from the anode nodes Anode_G and Anode_R of the adjacent pixels PXa and PXc may be minimized so that the driving transistor T1 of the corresponding pixel PXb may output the target output current and then the light emitting diode (LED) Edb of the corresponding pixel PXb may display the target luminance.

Referring to FIG. 8, the gate node Gate_B of the blue pixel (the second pixel PXb) and the anode node Anode_B overlap each other, but they are formed on the same pixel (the second pixel PXb), which ultimately maintains the target voltage and does not affect the display quality.

Next, the gate node Gate_R and the anode node Anode_R of the red pixel (the third pixel PXc) is described with reference to FIG. 9 and FIG. 10.

FIG. 9 shows the positions of the gate node Gate_R and the anode node Anode_R of the red pixel (the third pixel PXc) on a circuit diagram.

The gate node Gate_R of the red pixel (the third pixel PXc) not only includes the gate electrode 155c of the driving transistor T1, but also the gate electrode connecting member 176c that is connected thereto and connects the gate electrode 155c of the driving transistor T1 and the second semiconductor 132c of the input transistor T2. The gate node Gate_R may also include a part (a part of the second semiconductor 132c) always having the same voltage level as the gate electrode 155c of the driving transistor T1.

The anode node Anode_R of the red pixel (the third pixel PXc) includes the upper storage electrode 175c and the lower storage electrode 125c connected thereto as well as the anode 191c of the light emitting diode (LED) EDc. In addition, the anode node Anode_R may also include a part (a part of the first semiconductor 131c, a part of the third semiconductor 133c, and one terminal of the emission part capacitor Cledc) always having the same voltage level as the anode 191c of the light emitting diode (LED) EDc.

Referring to FIG. 2, it may be confirmed that the anodes 191a, 191b, and 191c among the constituent elements included in the anode node mainly affect the adjacent pixels. That is, as shown in FIG. 2, the anodes 191a, 191b, and 191c have a structure that is positioned on the pixel circuit unit of the adjacent pixels, so they significantly affect adjacent pixels.

On the other hand, the gate electrode 155c, which belongs to the gate node Gate_R of the red pixel (the third pixel PXc), is covered by the upper storage electrode 175c in a plan view, and the influence imparted from the anode 191a and 191b of the adjacent pixels PXa and PXb is small. Therefore, the gate electrode connecting member 176c, which is positioned uppermost among the gate node Gate_R of the red pixel (the third pixel PXc) and exposed, is most affected by the anodes 191a and 191b of the adjacent pixels PXa and PXb.

Therefore, the influence of the gate node Gate_R of the red pixel (the third pixel PXc) by the adjacent anode node may be confirmed based on the adjacent information of the anodes 191a and 191b of the adjacent pixels PXa and PXb and the gate electrode connecting member 176c of the red pixel (the third pixel PXc). Particularly, when the anodes 191a and 191b of the adjacent pixels PXa and PXb and the gate electrode connecting member 176c of the red pixel (the third pixel PXc) have the overlapping structure in a plan view, the driving transistor T1 of the corresponding pixel PXc may not output the target output current due to a large influence on the gate node Gate_G of the corresponding pixel from the anode node of the adjacent pixels PXa and PXb.

Referring to FIG. 2, the gate electrode 155c of the red pixel (the third pixel PXc) has a structure overlapping the anode 191b of the second pixel PXb in some regions. However, referring to FIG. 10, the upper storage electrode 175c is positioned between the gate electrode 155c and the anode 191b, so the upper storage electrode 175c prevents the anode 191b from affecting the gate electrode 155c. As a result, the influence between the gate electrode 155c and the anode 191b may be negligible.

Referring to FIG. 2 and FIG. 10, the gate electrode connecting member 176c of the red pixel (the third pixel PXc) has the structure that does not overlap the anode 191b of the second pixel PXb in a plan view. In addition, the anodes 191a and 191b of the adjacent pixels PXa and PXb and the gate electrode connecting members 176c of the red pixel (the third pixel PXc) are formed while maintaining a certain distance. As described above, they do not overlap with each other in a plan view, so there is little influence on the gate node Gate_R of the corresponding pixel PXc from the anode node of the adjacent pixels PXa and PXb and the driving transistor T1 of the corresponding pixel PXc may output the target output current.

Referring to FIG. 10, the gate electrode connecting member 176c of the gate node Gate_R in the red pixel (the third pixel PXc) has a structure that does not overlap with the anode 191c on a cross-section. As a result, compared to other pixels PXa and PXb, the gate electrode connecting member 176c of the gate node Gate_R in the red pixel (the third pixel PXc) has a structure that is not protected by the anode 191c.

However, like the first pixel PXa and the second pixel PXb, the anodes 191a and 191b of the corresponding pixels do not have to overlap the gate electrode connecting members 176a and 176b of the corresponding pixels in a plan view, and as just the gate electrode connecting member 176c does not overlap with the anodes 191a and 191b of the adjacent pixels in a plan view like the red pixel (the third pixel PXc), the driving transistor T1 of the corresponding pixel PXc may be able to output the target output current.

As described above, by the structure in which the gate electrode connecting member 176c of the gate node Gate_R does not overlap the anodes 191a and 191b of the adjacent pixels PXa and PXb in the red pixel (the third pixel PXc), the influence from the anode nodes Anode_G and Anode_B of the adjacent pixels PXa and PXb may be minimized so that the driving transistor T1 of the corresponding pixel PXc may output the target output current and then the light emitting diode (LED) EDc of the corresponding pixel PXc may display the target luminance.

In summary, in order to reduce the influence of the gate node of the corresponding pixel from the anode nodes of the adjacent pixels, the anodes 191 included in the anode nodes of the adjacent pixels and the gate electrode connecting member 176 included in the gate node of the corresponding pixel are disposed so as to not overlap each other in a plan view.

In this case, according to an embodiment, the anodes 191 of the adjacent pixels may overlap the gate electrode 155 of the corresponding pixel, but the upper storage electrode 175 is positioned above the gate electrode 155, thereby the influence is reduced. As a result, the anodes 191 of the adjacent pixels and the gate electrode 155 of the corresponding pixel may or may not overlap in a plan view.

Through arrangement of such a pixel, the gate node of the corresponding pixel has less influence from the anode node of the adjacent pixel, so the driving transistor T1 of the corresponding pixel constantly outputs the target output current and the light emitting diode (LED) ED of the corresponding pixel displays the target luminance.

In some embodiments, even in the red pixel (the third pixel PXc), the gate electrode connecting member 176c may have a structure covered by the anode 191c. That is, unlike FIG. 10, the gate electrode connecting member 176c is covered by the anode 191c of the corresponding pixel (the red pixel (the third pixel PXc)), so it may have a structure that blocks or minimizes the influence from the adjacent pixels (the second pixel PXb), etc. Based on the structure of FIG. 2, among three pixels PXa, PXb, and PXc, in two pixels, the anodes 191a and 191b and the gate electrode connecting members 176a and 176b are overlapped, respectively, but one pixel has a structure in which the anode 191c and the gate electrode connecting member 176c do not overlap.

In the above, the embodiment with the same circuit as FIG. 1 was mainly described. The embodiment of FIG. 1 is an embodiment in which the gate electrode of the initialization transistor T3 receives a different scan signal from the gate electrode of the input transistor T2.

However, according to another embodiment, the gate electrode of the initialization transistor T3 may receive the same scan signal (the first scan signal SC) as the gate electrode of the input transistor T2.

Figure 11:
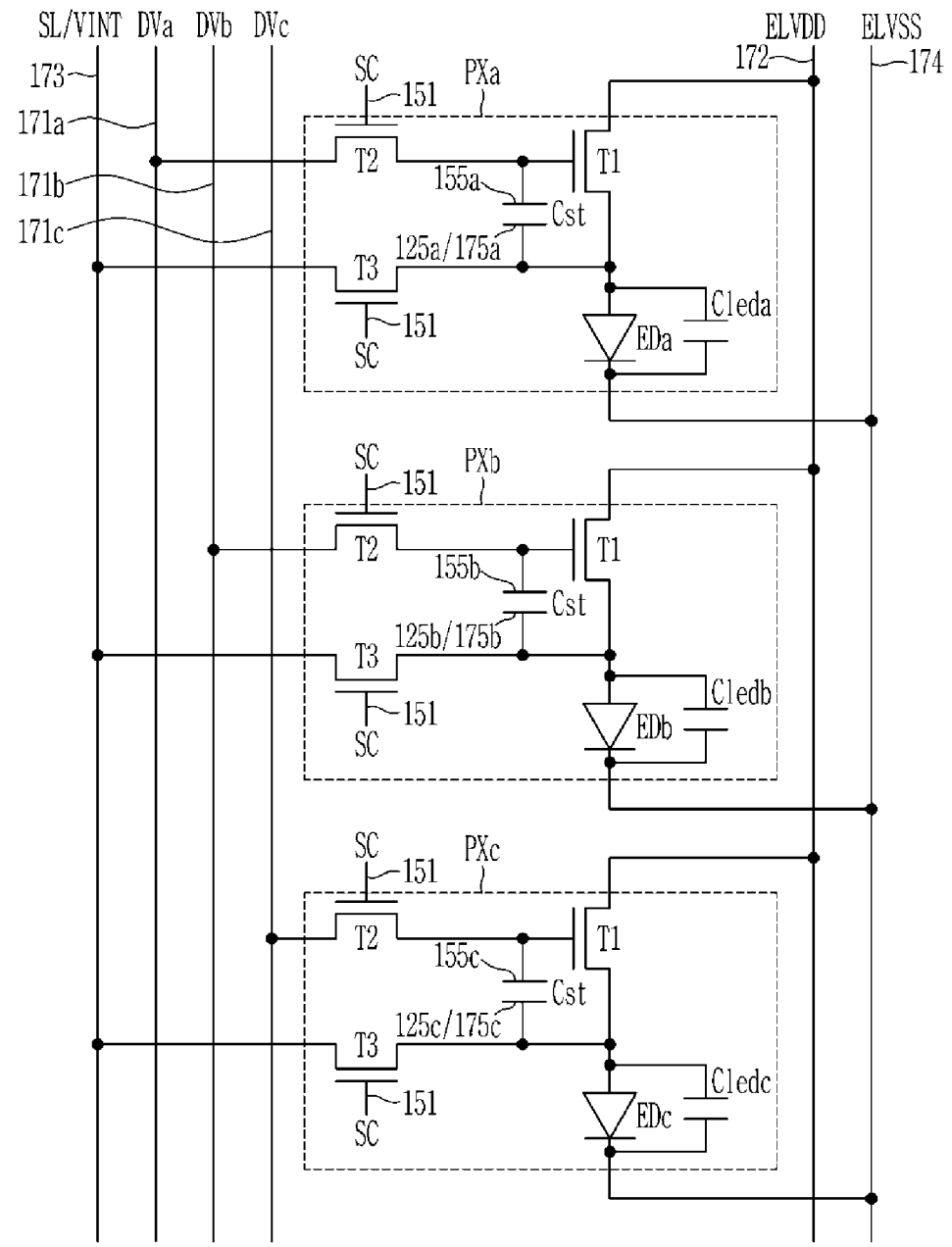
FIG. 11 is a circuit diagram of a pixel of a light emitting display device according to another embodiment.

This modified embodiment is described based on FIG. 11.

FIG. 11 is a circuit diagram of a pixel of a light emitting display device according to another embodiment.

In FIG. 11, unlike FIG. 1, the gate electrode of the initialization transistor T3 is connected to the first scan signal line 151 transmitting the first scan signal SC.

According to this embodiment, the writing operation in which the data voltage is input while the input transistor T2 is turned on, and the initialization operation in which the voltage of the anode of the light emitting diodes (LED) EDa, EDb, and EDc is changed into the initialization voltage VINT while the initialization transistor T3 is turned on and/or the sensing operation for sensing the voltage of the anode of the light emitting diode (LED) EDa, EDb, and EDc, are performed within the same period. At this time, the sensing operation may be performed before the initialization operation.

The higher resolution the display panel displays, the less space to form the pixel circuit unit on the panel is available. However, referring to FIG. 11, compared with the embodiment of FIG. 1, since one wire may be reduced, the panel may have a merit that it may secure the space to form the pixel circuit unit.

On the other hand, in the light emitting display device, the light emitting diode (LED) including the anode 191, the emission layer, and the cathode is formed on the fourth insulating layer 180, an encapsulation layer, a color conversion layer, or a color filter may be additionally formed on the light emitting diode (LED). Next, the cross-sectional structure of the entire light emitting display device is described with reference to FIG. 12.

FIG. 12 is a cross-sectional view entirely showing a light emitting display device according to an embodiment.

In FIG. 12, the pixel circuit unit is omitted from the configuration of the light emitting display device according to the embodiment described above, and the light emitting diodes (LED) EDa, EDb, and EDc are schematically illustrated starting from the anode 191.

As shown in FIG. 12, the anode 191 is formed on the substrate 110 for each pixel PXa, PXb, and PXc. The pixel circuit unit structure of a plurality of transistors, the insulating layers and the like disposed between the substrate 110 and the anode 191 is omitted, and for example, they may be disposed as shown in FIG. 2 and FIG. 3.

A partition layer 350 is positioned above the anode 191, and the partition layer 350 includes an opening 351 that exposes a portion of the anode 191.

The emission layer 370 may be positioned on the anode 191 and the partition layer 350, and in the present embodiment, the emission layer 370 is positioned over all regions. In this case, the emission layer 370 may be an emission layer that emits first color light that may be blue light. According to an embodiment, emission layers 370 may be formed to be separated from each other around the opening 351 of each pixel, and in this case, the emission layer of each pixel may emit light of different colors. The cathode 270 may be positioned on the emission layer 370 as a whole.

An encapsulation layer 380 including a plurality of insulating layers 381, 382, and 383 may be positioned on the cathode 270. The insulating layer 381 and the insulating layer 383 may include an inorganic insulating material, and the insulating layer 382 positioned between the insulating layer 381 and the insulating layer 383 may include an organic insulating material.

A filling layer 390 including a filler may be positioned on the encapsulation layer 380. A cover layer 400 including an insulating material, and a plurality of color conversion layers 430a and 430b and a transmission layer 430c may be positioned on the filling layer 390.

The transmission layer 430c may pass incident light. That is, the transmission layer 430c may transmit a first color light, which may be blue light. The transmission layer 430c may include a polymer material that transmits the first color light. The region in which the transmissive layer 430c is disposed may correspond to a light emitting region emitting blue light, and the transmissive layer 430c may pass the incident first color light as it is without including a separate semiconductor nanocrystal.

The color conversion layers 430a and 430b may include different semiconductor nanocrystals. For example, the first color light incident on the color conversion layer 430a may be converted to a second color light by the semiconductor nanocrystal included in the color conversion layer 430b and may then be emitted. The first color light incident on the color conversion layer 430b may be converted to a third color light by the semiconductor nanocrystal included in the color conversion layer 430b and may then be emitted.

The semiconductor nanocrystal may include at least one of a phosphor and a quantum dot material that converts the incident first color light into the second color light or the third color light.

A core of the quantum dot may be selected from a Group II-VI compound, a Group III-V compound, a Group IV-VI compound, a Group IV element, a Group IV compound, and a combination thereof.

The Group II-VI compound may be selected from the group consisting of a binary compound selected from the group consisting of CdSe, CdTe, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Group IV-VI compound may be selected from the group consisting of a binary compound selected from the group consisting of SnS, SnSe, SnTe, PbS, Pb Se, PbTe, and a mixture thereof; a ternary compound selected from the group consisting of SnSeS, SnSeTe, SnالسTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

In this case, the binary compound, the ternary compound, or the quaternary compound may exist in particles at a uniform concentration, or may exist in the same particle divided into states where concentration distributions are partially different. Further, the color conversion media layer may have a core/shell structure where one quantum dot surrounds another quantum dot. An interface between the core and the shell may have a concentration gradient, such that a concentration of an element existing in the shell is gradually reduced toward the center thereof.

In some exemplary embodiments, the quantum dot may have a core-shell structure including the core including the nanocrystal described above and a shell surrounding the core. The shell of the quantum dot serves as a protective layer to prevent chemical denaturation of the core and/or to serve as a charging layer to impart electrophoretic characteristics to the quantum dot. The shell may be a single layer or a multiple layer. The interface between the core and the shell may have a concentration gradient in which the concentration of the elements existing in the shell decreases toward the center. Examples of the shells of the quantum dot include metal or non-metal oxides, semiconductor compounds, or combinations thereof.

For example, the metal or nonmetal oxide may be a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and $NiO$, or a ternary compound such as $MgAl_2O_4$, $CoFe_2O_4$, $NiFe_2O_4$, and $CoMn_2O_4$, but the present invention is not limited thereto.

The semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb, however, the inventive concepts are not limited thereto.

The quantum dot may have a full width at half maximum (FWHM) of an emission wavelength spectrum of about 45 nm or less, about 40 nm or less, or about 30 nm or less, and in this range, color purity or color reproducibility may be improved. Also, since the light emitted through the quantum dot is emitted in all directions, the light viewing angle may be improved.

Further, a form of the quantum dot is one generally used in the art and is not particularly limited, but more specifically, forms such as spherical, pyramidal, multi-arm-shaped, or cubic nanoparticles, nanotubes, nanowires, nanofibers, and nanoplate-shaped particles may be used.

The quantum dot may adjust the color of emitted light depending on the particle size, so the quantum dot can have various luminescent colors such as blue, red, and green.

An insulating layer 440 may be disposed on the plurality of color conversion layers 430a and 430b and the transmissive layer 430c, and a plurality of color filters 450a, 450b, and 450c and a light blocking member 460 may be disposed thereon.

The color filter 450a may represent a second color light, the color filter 450b may represent a third color light, and the color filter 450c may represent a first color light.

The light blocking member 460 may be disposed between neighboring color filters 450a, 450b, and 450c.

A substrate 210 may be disposed on the plurality of color filter 450a, 450b, and 450c and the light blocking member 460. That is, the plurality of color conversion layers 430a and 430b and the plurality of color filters 450a, 450b, and 450c may be disposed between the substrate 110 and the substrate 210.

According to another exemplary embodiment, the emission layer 370 may include the quantum dot instead of the plurality of color conversion layers 430a and 430b and the transmissive layer 430c.

The substrates 110 and 210 may be formed of the same material. The substrate 110 may be formed up to the encapsulation layer 380, and the substrate 210 may be formed up to the color filters 450a, 450b, and 450c, the light blocking member 460, the insulating layer 440, the color conversion layers 430a and 430b, the transmission layer 430c, and the cover layer 400. After that, the upper and lower substrate structures may be formed to be attached by using the filling layer 390. In this case, the upper and lower structures may be attached by further including a sealant on the outer or inner sides of the filling layer 390.

According to the inventive concepts, by avoiding the overlapping of the anodes of adjacent pixels and at least some of the gate electrode nodes of the driving transistor of the corresponding pixel, the output current of the corresponding pixel driving transistor is not changed by adjacent pixels, and thereby a deterioration of the display quality may be prevented.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting display device comprising:
a first pixel including a first driving transistor, a first input transistor, a first initialization transistor, a first storage capacitor, and a first light emitting diode (LED); and
a second pixel including a second driving transistor, a second input transistor, a second initialization transistor, a second storage capacitor, and a second light emitting diode (LED),
wherein:
the first pixel further includes a first gate electrode connecting member connecting a first gate electrode of the first driving transistor and the first input transistor;
the second pixel further includes a second gate electrode connecting member connecting a second gate electrode of the second driving transistor and the second input transistor;

the first light emitting diode (LED) includes a first anode, and the second light emitting diode (LED) includes a second anode;

the first gate electrode connecting member does not overlap the second anode in a plan view;

the first pixel further includes a first upper storage electrode positioned on the first gate electrode and a first lower storage electrode positioned under the first gate electrode; and the second pixel further includes a second upper storage electrode disposed on the second gate electrode and a second lower storage electrode disposed under the second gate electrode.

2. The light emitting display device of claim 1, wherein:

the first gate electrode overlaps the first upper storage electrode or the first lower storage electrode in a plan view;

the first storage capacitor includes the first lower storage electrode, the first gate electrode, and the first upper storage electrode;

the second gate electrode overlaps the second upper storage electrode or the second lower storage electrode in a plan view; and the second storage capacitor includes the second lower storage electrode, the second gate electrode, and the second upper storage electrode.

3. The light emitting display device of claim 2, wherein:

the first gate electrode has a first protruded part that does not overlap the first upper storage electrode or the first lower storage electrode in a plan view;

the first protruded part is electrically connected to the first gate electrode connecting member;

the second gate electrode has a second protruded part that does not overlap the second upper storage electrode or the second lower storage electrode in a plan view; and the second protruded part is electrically connected to the second gate electrode connecting member.

4. The light emitting display device of claim 3, wherein:

the first gate electrode is positioned within a boundary of the first upper storage electrode or the first lower storage electrode except for the first protruded part in a plan view; and the second gate electrode is positioned within a boundary of the second upper storage electrode or the second lower storage electrode except for the second protruded part in a plan view.

5. The light emitting display device of claim 2, wherein:

the first initialization transistor is electrically connected to the first upper storage electrode; and the second initialization transistor is electrically connected to the second upper storage electrode.

6. The light emitting display device of claim 1, wherein:

the first upper storage electrode and the first lower storage electrode are electrically connected; and the second upper storage electrode and the second lower storage electrode are electrically connected.

7. The light emitting display device of claim 1, wherein the second gate electrode connecting member does not overlap the first anode in a plan view.

8. A light emitting display device comprising:

a first pixel including a first driving transistor, a first input transistor, a first initialization transistor, a first storage capacitor, and a first light emitting diode (LED);

a second pixel including a second driving transistor, a second input transistor, a second initialization transistor, a second storage capacitor, and a second light emitting diode (LED);

a third pixel including a third driving transistor, a third input transistor, a third initialization transistor, a third storage capacitor, and a third light emitting diode (LED);

wherein:

the first pixel further includes a first gate electrode connecting member connecting a first gate electrode of the first driving transistor and the first input transistor;

the second pixel further includes a second gate electrode connecting member connecting a second gate electrode of the second driving transistor and the second input transistor;

the third pixel further includes a third gate electrode connecting member connecting a third gate electrode of the third driving transistor and the third input transistor;

the first light emitting diode (LED) includes a first anode, the second light emitting diode (LED) includes a second anode, and the third light emitting diode (LED) includes a third anode;

the first gate electrode connecting member does not overlap the second anode in a plan view;

the second gate electrode connecting member does not overlap the first anode in a plan view; and the third gate electrode connecting member does not overlap the second anode and the third anode in a plan view.

9. The light emitting display device of claim 8, wherein the third anode does not overlap the first gate electrode connecting member and the second gate electrode connecting member in a plan view.

10. A light emitting display device comprising:

a first pixel including a first driving transistor, a first input transistor, a first initialization transistor, a first storage capacitor, and a first light emitting diode (LED); and a second pixel including a second driving transistor, a second input transistor, a second initialization transistor, a second storage capacitor, and a second light emitting diode (LED), wherein:

the first pixel further includes a first gate electrode connecting member connecting a first gate electrode of the first driving transistor and the first input transistor;

the second pixel further includes a second gate electrode connecting member connecting a second gate electrode of the second driving transistor and the second input transistor;

the first light emitting diode (LED) includes a first anode, and the second light emitting diode (LED) includes a second anode;

the first gate electrode connecting member does not overlap the second anode in a plan view;

the gate electrode of the first input transistor and the gate electrode of the second input transistor are integrally formed; and the gate electrode of the first initialization transistor and the gate electrode of the second initialization transistor are integrally formed.

11. A light emitting display device comprising:

a first pixel including a first driving transistor, a first input transistor, a first initialization transistor, a first storage capacitor, and a first light emitting diode (LED); and a second pixel including a second driving transistor, a second input transistor, a second initialization transistor, a second storage capacitor, and a second light emitting diode (LED), wherein:
the first pixel further includes a first gate electrode connecting member connecting a first gate electrode of the first driving transistor and the first input transistor;
the second pixel further includes a second gate electrode connecting member connecting a second gate electrode of the second driving transistor and the second input transistor;
the first light emitting diode (LED) includes a first anode, and the second light emitting diode (LED) includes a second anode;
the first gate electrode connecting member does not overlap the second anode in a plan view;
the gate electrode of the first input transistor and the gate electrode of the first initialization transistor receive the same control signal as each other or a control signal at different timings from each other; and
the gate electrode of the second input transistor and the gate electrode of the second initialization transistor receive the same control signal as each other or the control signal at different timings from each other.

12. A light emitting display device comprising:
a first pixel including a first driving transistor, a first input transistor, a first initialization transistor, a first storage capacitor, and a first light emitting diode (LED); and
a second pixel including a second driving transistor, a second input transistor, a second initialization transistor, a second storage capacitor, and a second light emitting diode (LED),
wherein:
the first pixel further includes a first gate electrode connecting member connecting a first gate electrode of the first driving transistor and the first input transistor;
the second pixel further includes a second gate electrode connecting member connecting a second gate electrode of the second driving transistor and the second input transistor;
the first light emitting diode (LED) includes a first anode, and the second light emitting diode (LED) includes a second anode;
the first gate electrode connecting member does not overlap the second anode in a plan view;
the first pixel further includes a first emission part capacitor connected to both ends of the first light emitting diode (LED); and
the second pixel further includes a second emission part capacitor connected to both ends of the second light emitting diode (LED).

13. A light emitting display device comprising:
a first pixel including a first driving transistor, a first input transistor, a first initialization transistor, a first storage capacitor, and a first light emitting diode (LED);
a second pixel including a second driving transistor, a second input transistor, a second initialization transistor, a second storage capacitor, and a second light emitting diode (LED); and
a third pixel including a third driving transistor, a third input transistor, a third initialization transistor, a third storage capacitor, and a third light emitting diode (LED),
wherein:
the first pixel further includes:
a first gate electrode connecting member connecting a first gate electrode of the first driving transistor and the first input transistor;
a first upper storage electrode positioned on the first gate electrode; and
a first lower storage electrode positioned under the first gate electrode;
the second pixel further includes:
a second gate electrode connecting member connecting a second gate electrode of the second driving transistor and the second input transistor;
a second upper storage electrode disposed on the second gate electrode; and
a second lower storage electrode disposed under the second gate electrode;
the third pixel further includes:
a third gate electrode connecting member connecting a third gate electrode of the third driving transistor and the third input transistor;
a third upper storage electrode disposed on the third gate electrode; and
a third lower storage electrode disposed under the third gate electrode;
the first light emitting diode (LED) includes a first anode, the second light emitting diode (LED) includes a second anode, and the third light emitting diode (LED) includes a third anode;
the first anode and the first gate electrode connecting member overlap each other in a plan view;
the second anode and the second gate electrode connecting member overlap each other in a plan view; and
the third anode and the third gate electrode connecting member do not overlap each other in a plan view.

14. The light emitting display device of claim 13, wherein:
the first gate electrode overlaps the first upper storage electrode or the first lower storage electrode in a plan view;
the first storage capacitor includes the first lower storage electrode, the first gate electrode, and the first upper storage electrode;
the second gate electrode overlaps the second upper storage electrode or the second lower storage electrode in a plan view;
the second storage capacitor includes the second lower storage electrode, the second gate electrode, and the second upper storage electrode;
the third gate electrode overlaps the third upper storage electrode or the third lower storage electrode in a plan view; and
the third storage capacitor includes the third lower storage electrode, the third gate electrode, and the third upper storage electrode.

15. The light emitting display device of claim 14, wherein:
the first gate electrode has a first protruded part that does not overlap the first upper storage electrode or the first lower storage electrode in a plan view;
the first protruded part is electrically connected to the first gate electrode connecting member;
the second gate electrode has a second protruded part that does not overlap the second upper storage electrode or the second lower storage electrode in a plan view;
the second protruded part is electrically connected to the second gate electrode connecting member;
the third gate electrode has a third protruded part that does not overlap the third upper storage electrode or the third lower storage electrode in a plan view; and
the third protruded part is electrically connected to the third gate electrode connecting member.

16. The light emitting display device of claim 15, wherein:
- the first gate electrode is disposed within the boundary of the first upper storage electrode or the first lower storage electrode except for the first protruded part in a plan view;
- the second gate electrode is disposed within the boundary of the second upper storage electrode or the second lower storage electrode except for the second protruded part in a plan view; and
- the third gate electrode is disposed within the boundary of the third upper storage electrode or the third lower storage electrode except for the third protruded part in a plan view.

17. The light emitting display device of claim 13, wherein:
- the first anode does not overlap the second gate electrode connecting member and the third gate electrode connecting member in a plan view;
- the second anode does not overlap the first gate electrode connecting member and the third gate electrode connecting member in a plan view; and
- the third anode does not overlap the first gate electrode connecting member and the second gate electrode connecting member in a plan view.

18. A light emitting display device comprising:
- a first pixel including a first driving transistor, a first input transistor, a first initialization transistor, a first storage capacitor, and a first light emitting diode (LED);
- a second pixel including a second driving transistor, a second input transistor, a second initialization transistor, a second storage capacitor, and a second light emitting diode (LED); and
- a third pixel including a third driving transistor, a third input transistor, a third initialization transistor, a third storage capacitor, and a third light emitting diode (LED), wherein:
- the first pixel further includes a first gate electrode connecting member connecting a first gate electrode of the first driving transistor and the first input transistor;
- the second pixel further includes a second gate electrode connecting member connecting a second gate electrode of the second driving transistor and the second input transistor;
- the third pixel further includes a third gate electrode connecting member connecting a third gate electrode of the third driving transistor and the third input transistor;
- the first light emitting diode (LED) includes a first anode, the second light emitting diode (LED) includes a second anode, and the third light emitting diode (LED) includes a third anode;
- the first anode and the first gate electrode connecting member overlap each other in a plan view;
- the second anode and the second gate electrode connecting member overlap each other in a plan view;
- the third anode and the third gate electrode connecting member do not overlap each other in a plan view;
- the gate electrode of the first input transistor, the gate electrode of the second input transistor, and the gate electrode of the third input transistor are integrally formed; and
- the gate electrode of the first initialization transistor, the gate electrode of the second initialization transistor, and the gate electrode of the third initialization transistor are integrally formed.

\* \* \* \* \*